United States Patent
Fujimura

(10) Patent No.: US 8,731,123 B2
(45) Date of Patent: May 20, 2014

(54) DEMULTIPLEXING DEVICE, MULTIPLEXING DEVICE, AND RELAY DEVICE

(75) Inventor: Akinori Fujimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/511,893

(22) PCT Filed: Nov. 18, 2010

(86) PCT No.: PCT/JP2010/070602
§ 371 (c)(1),
(2), (4) Date: May 24, 2012

(87) PCT Pub. No.: WO2011/065287
PCT Pub. Date: Jun. 3, 2011

(65) Prior Publication Data
US 2012/0269238 A1    Oct. 25, 2012

(30) Foreign Application Priority Data
Nov. 30, 2009   (JP) .................. 2009-272105

(51) Int. Cl.
*H04B 1/10*    (2006.01)
(52) U.S. Cl.
USPC ........... 375/350; 342/111; 342/116; 370/481; 455/20; 455/313
(58) Field of Classification Search
None
See application file for complete search history.

(56) References Cited

U.S. PATENT DOCUMENTS

| | | | |
|---|---|---|---|
| 6,014,366 A | 1/2000 | Ichiyoshi | |
| 6,647,075 B1 * | 11/2003 | Genrich | 375/316 |
| 6,714,529 B1 | 3/2004 | Tanabe et al. | |
| 2006/0159207 A1 * | 7/2006 | Wagner et al. | 375/344 |
| 2007/0259631 A1 * | 11/2007 | Ljung et al. | 455/127.2 |
| 2009/0304031 A1 | 12/2009 | Kobayashi et al. | |
| 2010/0023322 A1 * | 1/2010 | Schnell et al. | 704/211 |
| 2011/0222467 A1 | 9/2011 | Fujimura et al. | |

FOREIGN PATENT DOCUMENTS

| | | |
|---|---|---|
| JP | 8 84049 | 3/1996 |
| JP | 2738385 | 1/1998 |
| JP | 2001 51975 | 2/2001 |
| JP | 2001 111639 | 4/2001 |
| WO | 2007 136010 | 11/2007 |
| WO | 2010 064485 | 6/2010 |

OTHER PUBLICATIONS

Yamashita, F., et al., "A Proposal of Onboard Bandwidth-variable FFT Filter Banks and its Fundamental Characteristics", IEICE Transactions B, vol. J85-B, No. 12, pp. 2290-2299, (Dec. 1, 2002) (with English abstract).
International Search Report Issued Feb. 22, 2011 in PCT/JP10/70602 Filed Nov. 18, 2010.

* cited by examiner

*Primary Examiner* — Adolf Dsouza
(74) *Attorney, Agent, or Firm* — Oblon, Spivak, McClelland, Maier & Neustadt, L.L.P.

(57) ABSTRACT

A demultiplexing device that includes frequency-conversion and reception low-pass-filter units that perform a frequency converting process and a low-pass filtering process for causing a signal to pass through a desired band, perform down-sampling to reduce a sampling rate to half of a data rate of an input signal, and output the signal, reception channel-filter units that waveform-shape a signal with a desired frequency characteristic and output the waveform-shaped signal. The demultiplexing device also includes a filter-bank control unit that generates a clock control signal for supplying a clock to frequency-conversion and reception low-pass-filter units and reception channel-filter units corresponding to signal passage bands, based on channel information, and a reception-clock supply unit that supplies a clock to frequency-conversion and reception low-pass-filter units and reception channel-filter units corresponding to signal passage bands, based on the clock control signal.

18 Claims, 19 Drawing Sheets

FIG.11

| STAGE | FREQUENCY-CONVERSION AND RECEPTION LOW-PASS-FILTER UNIT | EXTRACTION AREA |
|---|---|---|
| 1 | 101 | (5), (6), (7), (8) |
| 1 | 102 | (1), (2), (3), (4) |
| 2 | 103 | (7), (8) |
| 2 | 104 | (5), (6) |
| 2 | 105 | (3), (4) |
| 2 | 106 | (1), (2) |
| 3 | 107 | (8) |
| 3 | 108 | (7) |
| 3 | 109 | (6) |
| 3 | 110 | (5) |
| 3 | 111 | (4) |
| 3 | 112 | (3) |
| 3 | 113 | (2) |
| 3 | 114 | (1) |

FIG.12

| STAGE | TRANSMISSION LOW-PASS-FILTER AND FREQUENCY-CONVERTING UNIT | ADDER | MULTIPLEXING TARGET AREA |
|---|---|---|---|
|  |  | 337 | (1), (2), (3), (4), (5), (6), (7), (8) |
| 1 | 323 | 335 | (5), (6), (7), (8) |
|  | 324 | 336 | (1), (2), (3), (4) |
| 2 | 319 | 331 | (7), (8) |
|  | 320 | 332 | (5), (6) |
|  | 321 | 333 | (3), (4) |
|  | 322 | 334 | (1), (2) |
| 3 | 311 |  | (8) |
|  | 312 |  | (7) |
|  | 313 |  | (6) |
|  | 314 |  | (5) |
|  | 315 |  | (4) |
|  | 316 |  | (3) |
|  | 317 |  | (2) |
|  | 318 |  | (1) |

DEMULTIPLEXING DEVICE, MULTIPLEXING DEVICE, AND RELAY DEVICE

FIELD

The present invention relates to a demultiplexing device that demultiplexes a plurality of signals having various bandwidths.

BACKGROUND

Conventionally, multirate digital multiplexing device and digital demultiplexing device can perform digital demultiplexing and digital multiplexing of signals with various bandwidths using combination of a subfilter and a Fourier transform (or fast Fourier transform: FFT) unit. Technologies related to the multirate digital multiplexing device and digital demultiplexing device are disclosed in Patent Literature 1 and Non Patent Literature 1 mentioned below.

CITATION LIST

Patent Literature

Patent Literature 1: Japanese Patent No. 2738385

Non Patent Literature

Non Patent Literature 1: Fumihiro YAMASHITA, Hiroshi KAZAMA, and Yoshinori NAKASUGA, "A Proposal of Onboard Bandwidth-variable FFT Filter Banks and its Fundamental Characteristics", IEICE Transactions B, Vol. J85-B, No. 12, pp. 2290 to 2299, December 2002

SUMMARY

Technical Problem

However, according to the conventional technologies, a Fourier transform (or fast Fourier transform) circuit performs processing targeted for an entire system band and accordingly even when a part of the entire system band is a processing target band for demultiplexing/multiplexing, it is impossible to operate only a part of the circuit in view of the operating principle. Therefore, even when a part of the entire system band is a processing target band for demultiplexing/multiplexing, power consumption cannot be reduced.

The present invention has been achieved in view of the above problems, and an object of the present invention is to provide a demultiplexing/multiplexing device that can reduce power consumption.

Solution to Problem

In order to solve above-mentioned problems and achieve the object of the present invention, there is provided a demultiplexing device that demultiplexes a reception signal into $2^N$ waves (N is a natural number equal to or larger than one), the demultiplexing device comprising: a reception low-pass-filter group including $2^{N+1}-2$ frequency-conversion and reception low-pass-filter units that perform a frequency converting process and a low-pass filtering process for causing a signal obtained by A/D-converting the reception signal to pass through a desired band, perform downsampling to reduce a sampling rate to half of a data rate of an input signal, and output a processed signal, having the frequency-conversion and reception low-pass-filter units arranged in a tree with an N-stage configuration, dividing an output signal from each of $2^M$ frequency-conversion and reception low-pass-filter units arranged at an Mth stage (1≤M≤N) into two, and inputting the divided signals to two different frequency-conversion and reception low-pass-filter units at a subsequent stage; a reception channel-filter group including $2^N$ reception channel-filter units that waveform-shape signals from the frequency-conversion and reception low-pass-filter units according to a desired frequency characteristic to output the waveform-shaped signals and are connected to $2^N$ frequency-conversion and reception low-pass-filter units at an Nth stage in a one-to-one relation; a filter-bank control unit that generates a clock control signal for supplying a clock to frequency-conversion and reception low-pass-filter units and reception channel-filter units corresponding to a signal passage band, based on channel information estimated from the reception signal; and a reception-clock supply unit that supplies a clock to frequency-conversion and reception low-pass-filter units and reception channel-filter units corresponding to the signal passage band, based on the clock control signal.

Advantageous Effects of Invention

The demultiplexing device according to the present invention can reduce power consumption.

BRIEF DESCRIPTION OF DRAWINGS

FIG. 11 depicts extraction target areas of respective frequency-conversion and reception low-pass-filter units.

FIG. 12 depicts multiplexing target areas of respective transmission low-pass-filter and frequency-converting units and respective adders.

DESCRIPTION OF EMBODIMENTS

Exemplary embodiments of a demultiplexing device according to the present invention will be explained below in detail with reference to the accompanying drawings. The present invention is not limited to the embodiments.

First Embodiment

In a first embodiment of the present invention, a demultiplexing device and a multiplexing device that can reduce power consumption, and a relay device including the demultiplexing device and the multiplexing device are explained.

Figure 1:
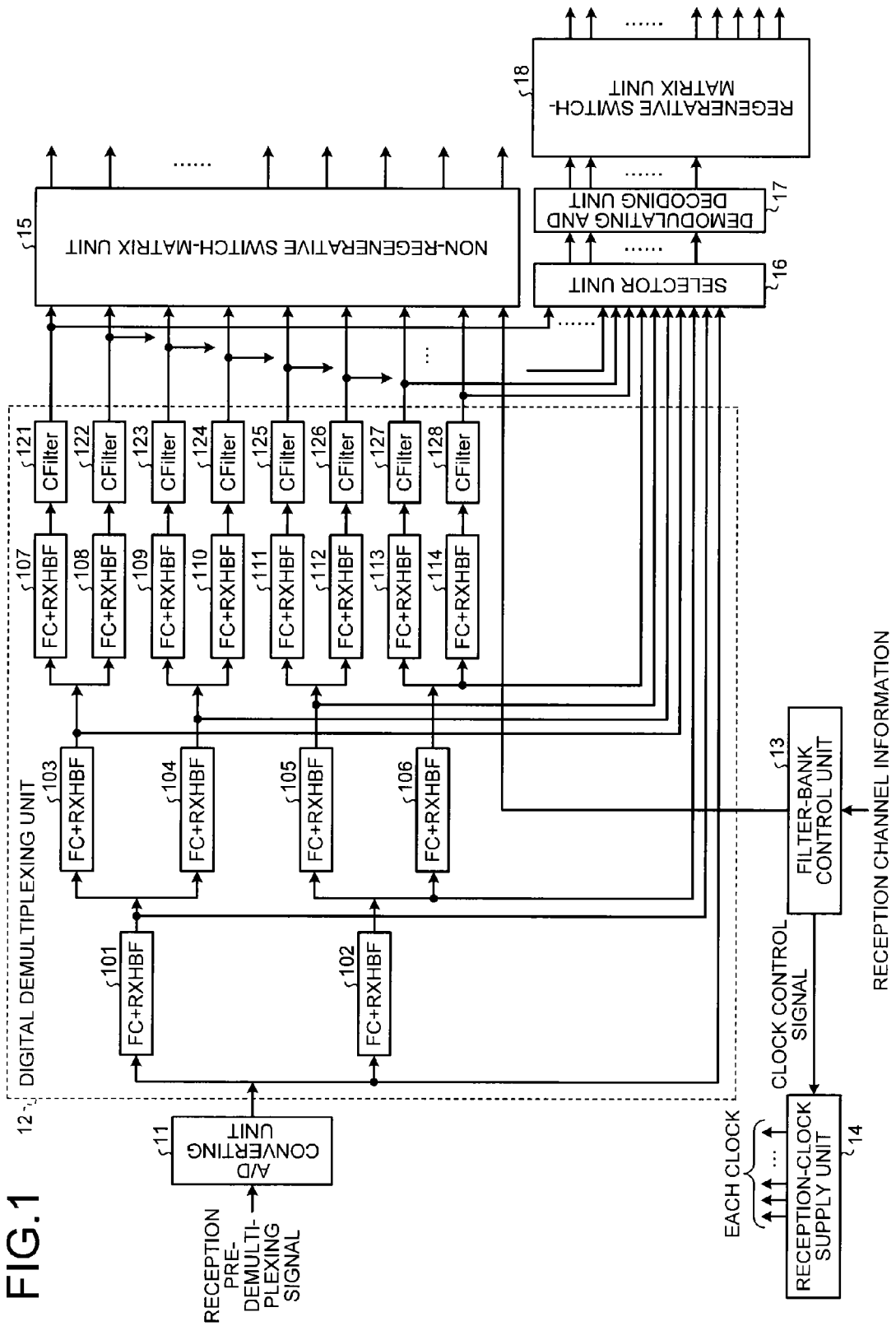
FIG. 1 is a configuration example of a digital demultiplexing device.

FIG. 1 is a configuration example of a digital demultiplexing device according to the present embodiment. The digital demultiplexing device has a 3-stage configuration. When the number of stages is denoted by stage (=1, 2, 3, . . . ), a maximum number of subwaves can be expressed as "$2^{stage}$". Because stage=3 in the configuration shown in FIG. 1, demultiplexing into a maximum of eight (=$2^3$) subwaves is realized. While a case where stage=3 is explained in the present embodiment, the present embodiment can be also applied to cases where stage=4 or more.

In FIG. 1, the digital demultiplexing device includes an A/D converting unit 11 that performs analog/digital conversion of a reception pre-demultiplexing signal, a digital demultiplexing unit 12 that demultiplexes a signal subjected to the A/D conversion, a filter-bank control unit 13 that controls operations of constituent elements based on reception channel information, a reception-clock supply unit 14 that supplies a clock to the constituent elements based on clock control information, a non-regenerative switch-matrix unit 15 that selects some or all of input signals to change arrangement in a frequency direction and outputs the processed signals, a selector unit 16 that selects regenerative relay signals from the signals during demultiplexing, a demodulating and decoding unit 17 that performs a demodulating and decoding process for the regenerative relay signals, and a regenerative switch-matrix unit 18 that outputs demodulated and decoded data through a set route.

The digital demultiplexing unit 12 includes frequency-conversion and reception low-pass filter units 101 to 114 that perform a frequency-converting and low-pass filtering process for a signal, then reduce a sampling rate thereof to half of an input data rate, and output the processed signal, and reception channel-filter units 121 to 128 that perform a filtering process for output signals from the frequency-conversion and reception low-pass filter units 107 to 114.

Figure 2:
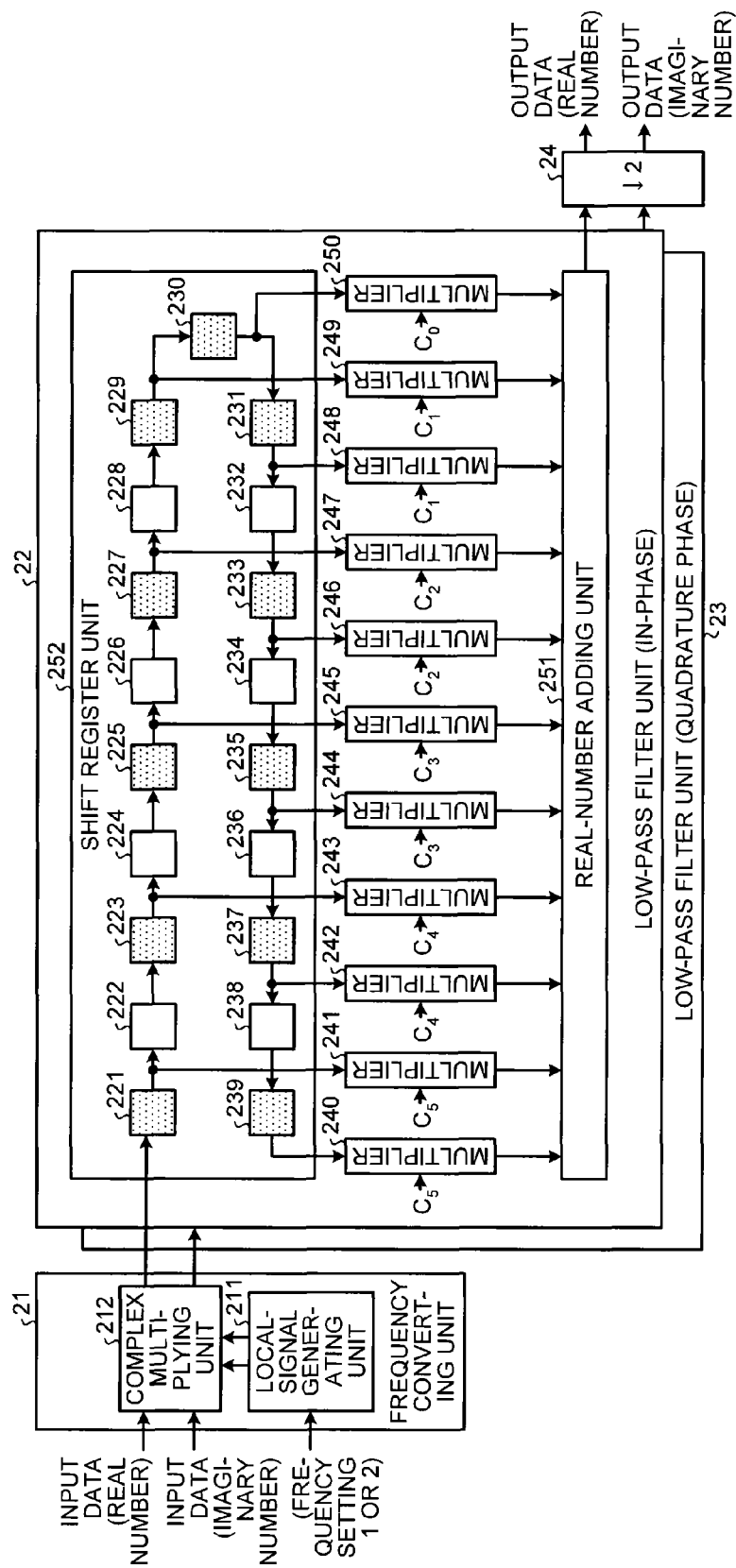
FIG. 2 is a configuration example of frequency-conversion and reception low-pass-filter units.

FIG. 2 is a configuration example of the frequency-conversion and reception low-pass-filter units 101 to 114. This is a configuration in which the number of taps in a filter is 19. The frequency-conversion and reception low-pass-filter units 101 to 114 each include a frequency converting unit 21, a low-pass filter unit (in-phase) 22, a low-pass filter unit (quadrature phase) 23, and a downsampler unit 24 that thins output data from the low-pass filter units 22 and 23 to half (that is, picks up every second data and discards the rest). The reception low-pass filter units can be halfband filters that reduce a circuit scale (the number of multipliers). The frequency converting unit 21 includes a local-signal generating unit 211 and a complex multiplying unit 212, and realizes arbitrary (free) frequency offset according to external setting. The low-pass filter unit (in-phase) 22 includes a shift register unit 252 including register units 221 to 239, multipliers 240 to 250, and a real-number adding unit 251. The low-pass filter unit (quadrature phase) 23 has the same configuration as that of the low-pass filter unit (in-phase) 22.

Figure 3:
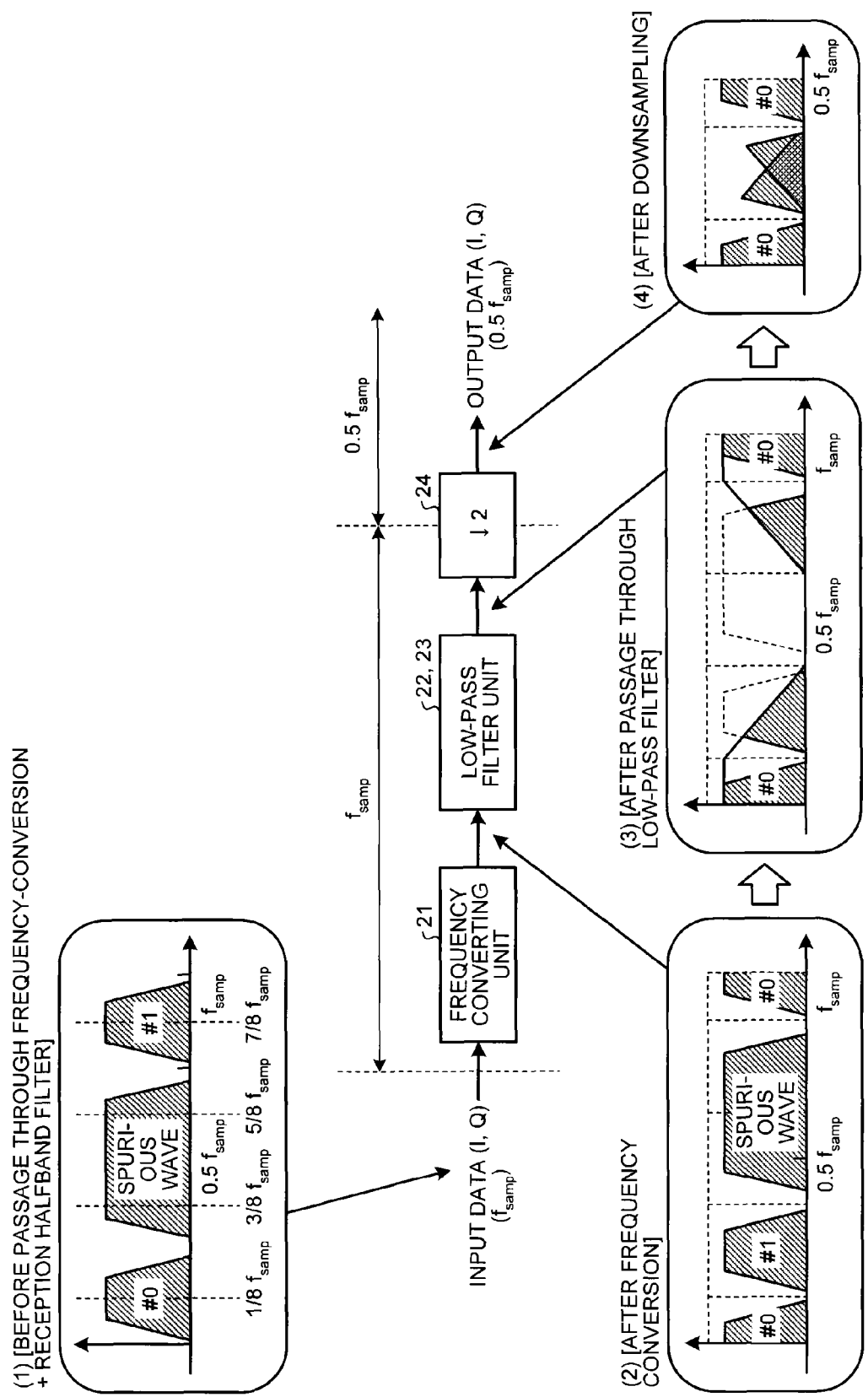
FIG. 3 depicts a process of the frequency-conversion and reception low-pass-filter units.

A process performed by the frequency-conversion and reception low-pass-filter units 101 to 114 is explained. FIG. 3 depicts a process performed by the frequency-conversion and reception low-pass-filter units 101 to 114. Each of the frequency-conversion and reception low-pass-filter units 101 to 114 extracts a part of a band (a bandwidth $f_{samp}$) of an input signal sampled at a sampling rate of $f_{samp}$ with a low-pass filter while performing downconversion to obtain a central frequency of zero.

For example, when there is three signal spectrums (#0, spurious wave, and #1) in an input signal band as shown in (1) in FIG. 3 and the signal #0 is to be extracted therefrom, the frequency converting unit 21 offsets the signal spectrums by either of (±0.125 $f_{samp}$). In this example, $f_{samp}$ denotes a sampling frequency.

The frequency converting unit 21 shifts the frequency by −0.125 $f_{samp}$ to convert a central frequency of the signal #0 to zero ((2) in FIG. 3, #0). Similarly, when the frequency is shifted by +0.125 $f_{samp}$, a central frequency of the signal #1 is converted to zero. The frequency converting unit 21 performs either of the two frequency converting processes.

The low-pass filter units 22 and 23 cause the signal, which has been frequency-converted in the process mentioned above to obtain the central frequency of zero (DC), to pass through and filter out at least some of signal components in an area between 0.25 $f_{samp}$ and 0.75 $f_{samp}$ ((3) in FIG. 3: when the signal #0 is converted to DC).

The downsampler unit 24 thins data that has passed through the low-pass filter units 22 and 23 to half and accordingly frequency components of a signal before thinning in an area between 0.5 $f_{samp}$ and 1.0 $f_{samp}$ are overlapped with frequency components in an area between 0.0 $f_{samp}$ and 0.5 $f_{samp}$. However, because the signal components in the area between 0.25 $f_{samp}$ and 0.75 $f_{samp}$ are previously filtered out by the low-pass filter units 22 and 23, alias components do not overlap the signal band to be extracted, which prevents deterioration in S/N ((4) in FIG. 3). While (2) to (4) in FIG. 3 represent a process of extracting the target signal band after the signal #0 is frequency-converted to DC, the extraction can be similarly achieved after the signal #1 is frequency-converted to DC when the frequency converting unit 21 frequency-converts the signal #1 to have the central frequency of zero.

Figure 4:
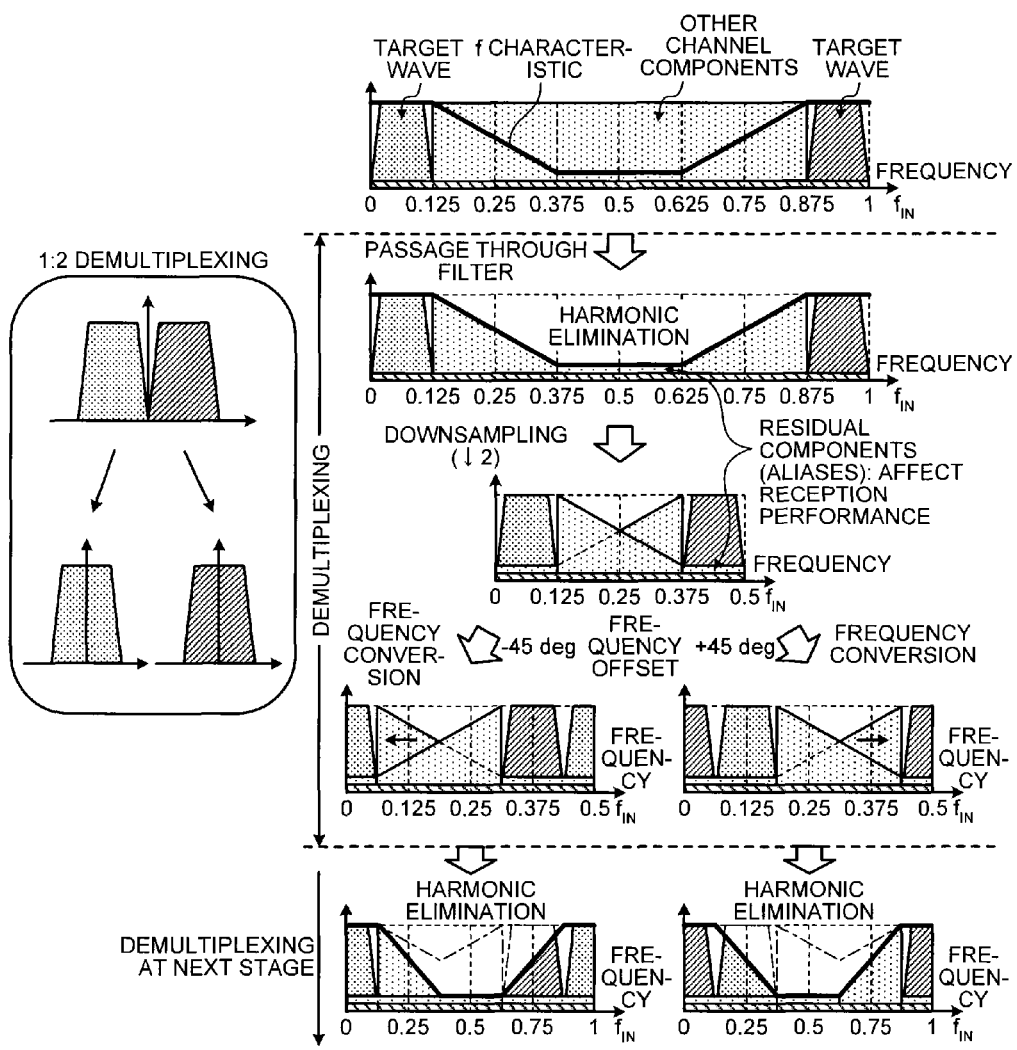
FIG. 4 depicts a 1:2 demultiplexing process on a frequency axis.

FIG. 4 depicts a 1:2 demultiplexing process on a frequency axis, in which a flow of . . . →low-pass filtering→downsampling→frequency conversion→ . . . is shown. In the demultiplexing process according to the present embodiment, a process of "frequency conversion→low-pass filtering→downsampling→frequency conversion→low-pass filtering→downsampling . . . " is repeated until a sampling rate after downsampling is twice as high as a minimum channel width (Fc) that contains a minimum signal bandwidth (a bandwidth Bw) of the system. Although a signal having a wider bandwidth (2Bw, 3Bw, 4Bw, . . . ) is decomposed to plural signals during this process, it causes no problem. Because one (one cycle of) demultiplexing process itself is equivalent to an existing method, detailed explanations thereof will be omitted.

Figure 5:
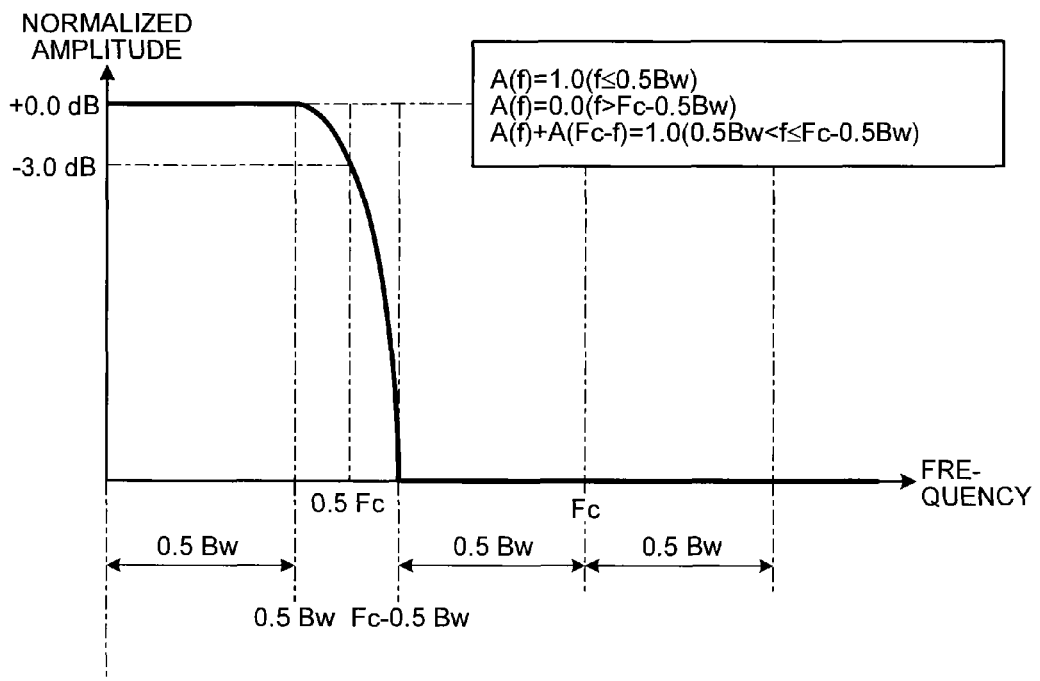
FIG. 5 depicts a frequency characteristic of reception channel-filter units.

The reception channel-filter units 121 to 128 waveform-shape the signals output from the frequency-conversion and reception low-pass-filter units 107 to 114 at the last stage according to a frequency characteristic shown in FIG. 5 to extract only target signals, respectively.

The channel filters require such an amplitude-frequency characteristic (A(f)) that a sum of the amplitude-frequency characteristic (A(f)) and a characteristic (A(Fc−f)) obtained by flipping the frequency characteristic (A(f)) along the central frequency Fc is fixed. For example, the amplitude-frequency characteristic (A(f)) required for the channel filters satisfies the following expressions.

$$A(f)=1.0(f \leq 0.5Bw) \quad (1)$$

$$A(f)=0.0(f>Fc-0.5Bw) \quad (2)$$

$$A(f)+A(Fc-f)=1.0(0.5Bw<f \leq Fc-0.5Bw) \quad (3)$$

Furthermore, as shown in FIG. 5, A(f)=0.5 (−3.0 dB) when f=0.5Fc.

A full Nyquist filter has this characteristic, for example, and the channel filters can be configured with halfband filters with a small circuit scale because the sampling rate is twice as high as Fc.

When the wideband signal (2Bw, 3Bw, 4Bw, . . . ) having been decomposed to the plural signals during the above process is composed again, extraction of the target waves with performing waveform shaping by using the channel filters having the characteristic mentioned above enables recovery of the original wideband signal without waveform or spectrum distortion.

Figure 6:
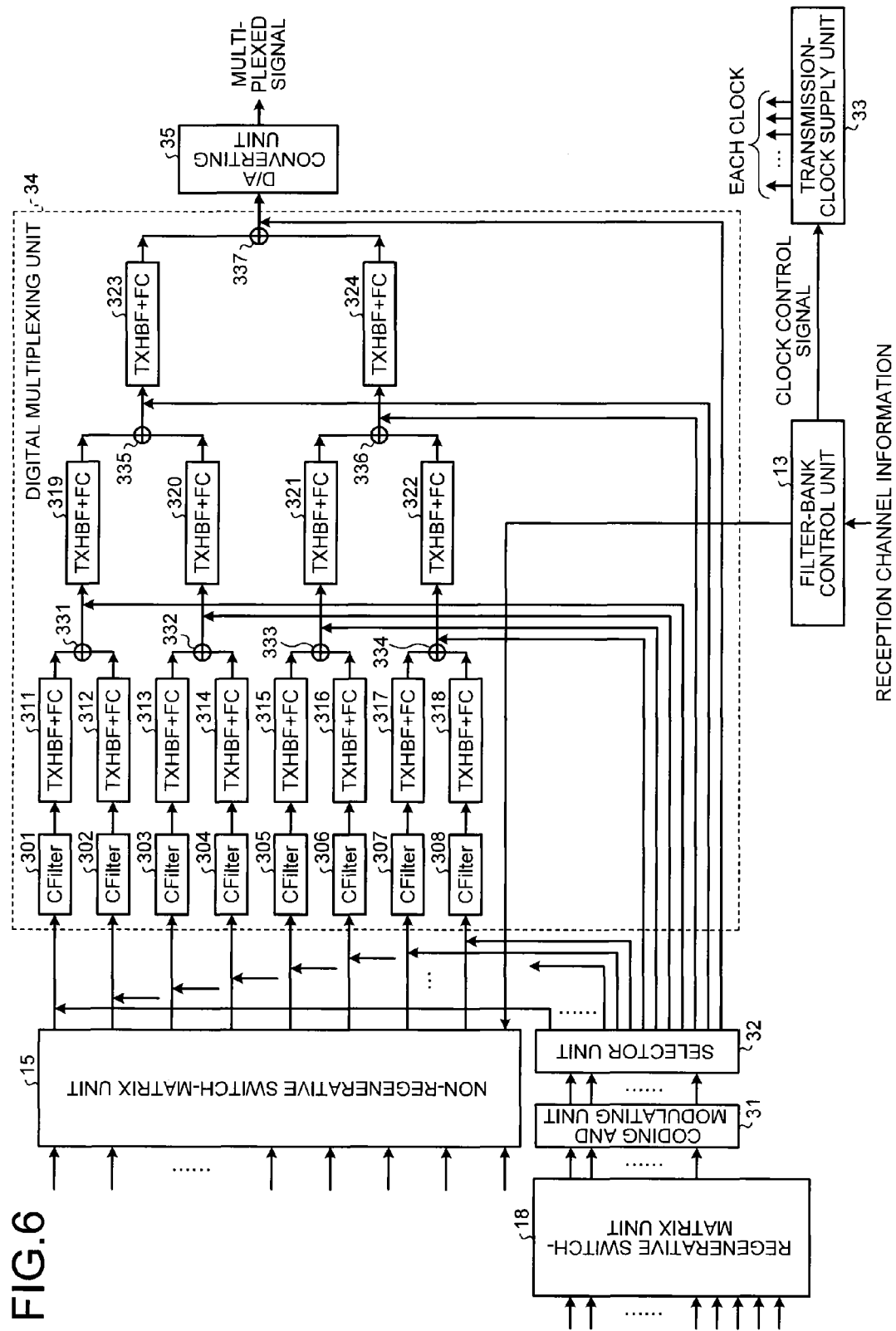
FIG. 6 is a configuration example of the digital multiplexing device.

The digital multiplexing device is explained next. The digital multiplexing device multiplexes signals demultiplexed by the digital demultiplexing device. FIG. 6 is a configuration example of the digital multiplexing device according to the present embodiment. As the digital demultiplexing device, the digital multiplexing device has a 3-stage configuration (stage=3) and realizes multiplexing of a maximum of eight (=2³) waves. The present embodiment can be applied also to cases where stage=4 or more.

In FIG. 6, the digital multiplexing device includes the regenerative switch-matrix unit 18, a coding and modulating unit 31 that performs a coding and modulating process for a signal, a selector unit 32 that distributes the coded and modulated signal to inputs of transmission low-pass-filter and frequency-converting units at the respective stages, the non-regenerative switch-matrix unit 15, the filter-bank control unit 13, a transmission-clock supply unit 33 that supplies a clock to constituent elements based on clock control information, a digital multiplexing unit 34 that multiplexes signals from the non-regenerative switch-matrix unit 15 or the regenerative switch-matrix unit 18, and a D/A converting unit 35 that performs digital/analog conversion to generate a multiplexed signal and outputs the multiplexed signal.

The digital multiplexing unit 34 includes transmission channel-filter units 301 to 308 that perform a filtering process for the output signal from the non-regenerative switch-matrix unit 15 or the signal distributed by the selector unit 32, transmission low-pass-filter and frequency-converting units 311 to 324 that perform interpolation to obtain a sampling rate twice as high as an input data rate, then perform frequency conversion, and output the processed signal, and adders 331 to 337 that add output signals from two of the transmission low-pass-filter and frequency-converting units 311 to 324 corresponding to adjacent bands.

Figure 7:
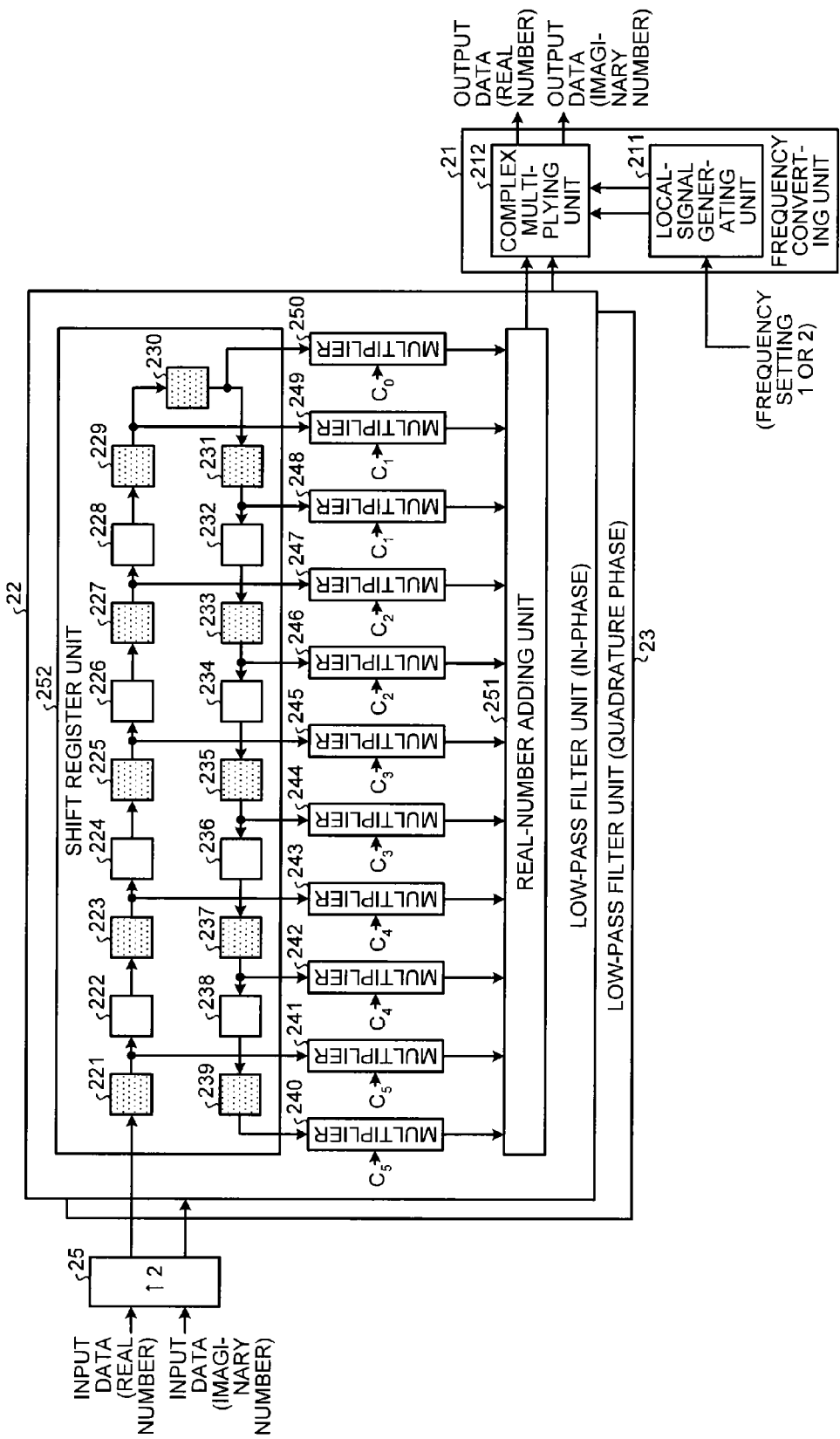
FIG. 7 is a configuration example of transmission low-pass-filter and frequency-converting units.

FIG. 7 is a configuration example of the transmission low-pass-filter and frequency-converting units 311 to 324. This is a configuration in which the number of taps in a filter is 19. The transmission low-pass-filter and frequency-converting units 311 to 324 each include an upsampler unit 25 that performs upsampling (that is, insert zero between respective input data) to double the input data (real numbers and imaginary numbers), the low-pass filter unit (in-phase) 22, the low-pass filter unit (quadrature phase) 23, and the frequency converting unit 21. The low-pass filter unit (in-phase) 22, the low-pass filter unit (quadrature phase) 23, and the frequency converting unit 21 have the same configurations as those of the low-pass filter unit (in-phase) 22, the low-pass filter unit (quadrature phase) 23, and the frequency converting unit 21 shown in FIG. 2, respectively. The transmission low-pass-filter units also can be configured with halfband filters as on the reception side.

Figure 8:
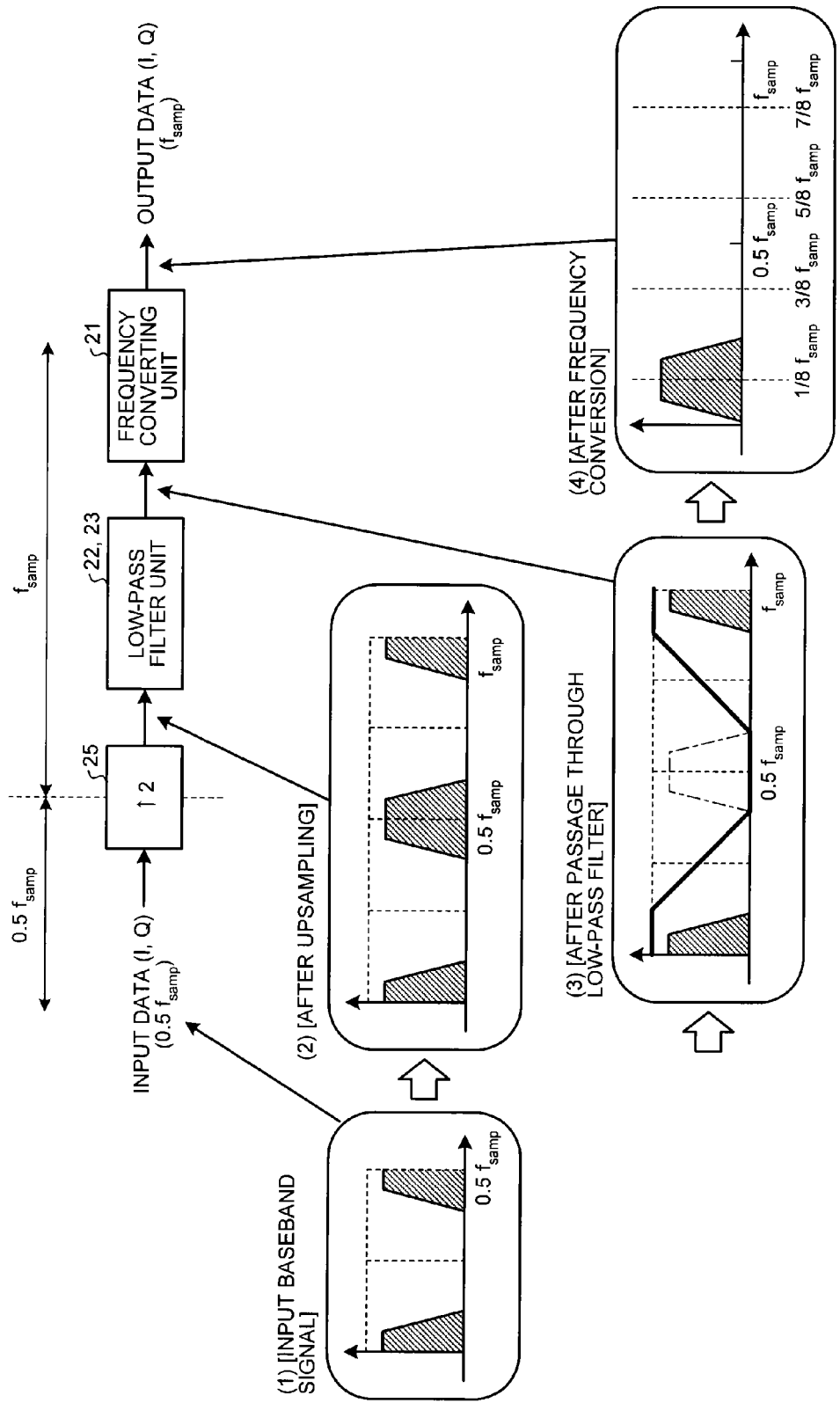
FIG. 8 depicts a process of the transmission low-pass-filter and frequency-converting units.

A process performed by the transmission low-pass-filter and frequency-converting units 311 to 324 is explained. FIG. 8 depicts a process performed by the transmission low-pass-filter and frequency-converting units 311 to 324. The transmission low-pass-filter and frequency-converting units 311 to 324 each offset a central frequency of an input signal to either of (±0.125 $f_{samp}$) while interpolating a sampling rate (=0.5 $f_{samp}$) of the input signal to be doubled (=1.0 $f_{samp}$).

For example, an input baseband signal ((1) in FIG. 8) is upsampled by the upsampler unit 25 to obtain a rate twice as high as the input rate ((2) in FIG. 8), image components thereof are eliminated by the low-pass filter units 22 and 23 ((3) in FIG. 8), and then the signal is offset by the frequency converting unit 21 to have a central frequency of +0.125 $f_{samp}$ ((4) in FIG. 8). Similarly, after passing through the upsampler unit 25 and the low-pass filter units 22 and 23, the input baseband signal can be offset by the frequency converting unit 21 to have a central frequency of −0.125 $f_{samp}$.

Figure 9:
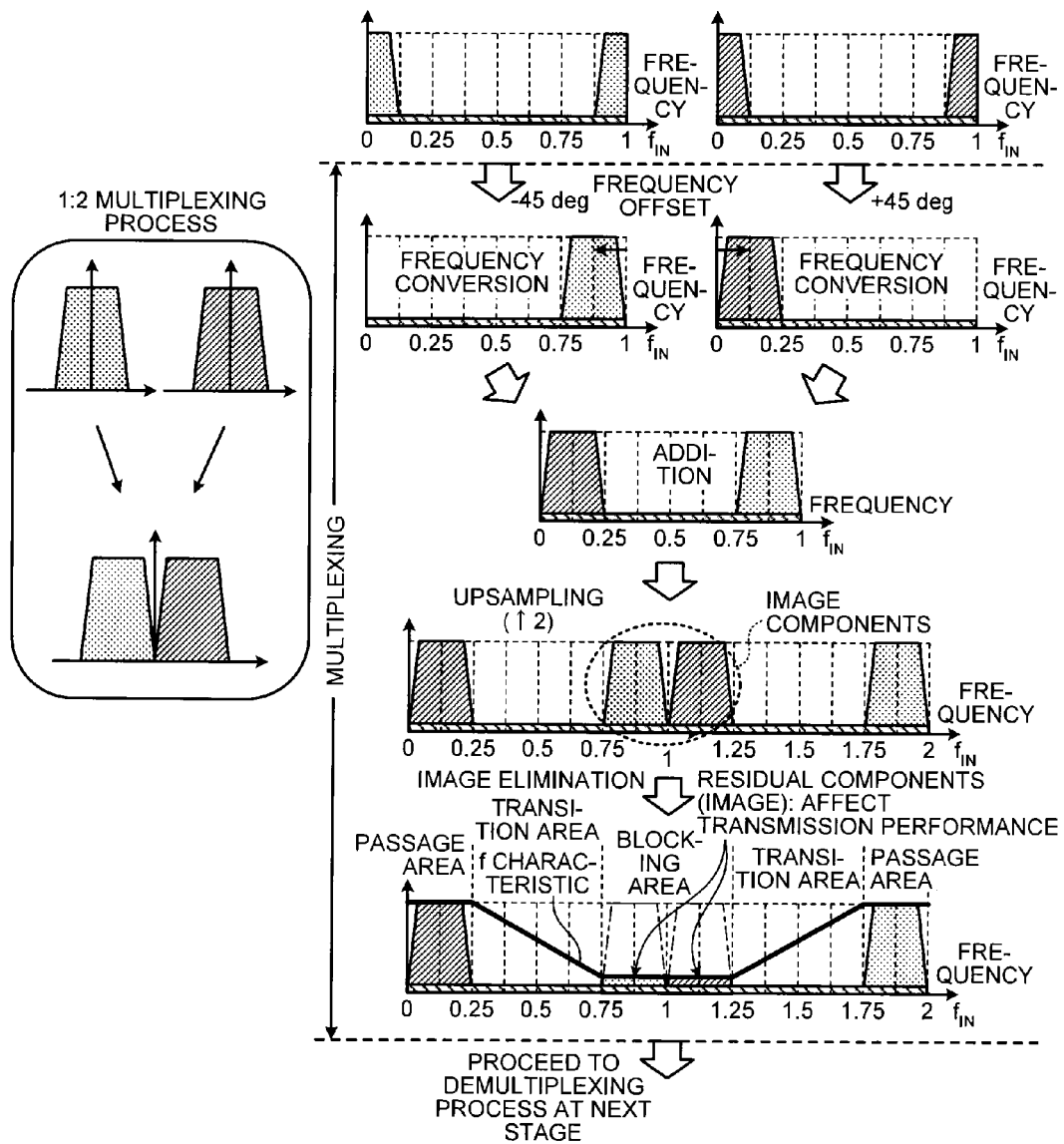
FIG. 9 depicts a 2:1 multiplexing process on a frequency axis.

FIG. 9 depicts a 2:1 multiplexing process on a frequency axis, in which a flow of→frequency conversion→addition→upsampling→low-pass filtering→ . . . is shown. In the multiplexing process according to the present embodiment, a process of adding another signal is performed after performing "upsampling→low-pass filtering→frequency conversion" and accordingly a process of "upsampling→low-pass filtering→frequency conversion→addition→upsampling→low-pass filtering→frequency conversion→addition . . . " is repeated until a sampling rate after upsampling reaches a sampling rate of the D/A converting unit 35. When two signals are to be added, one of the signals is offset to have a central frequency of +0.125 $f_{samp}$ and the other is offset to have a central frequency of −0.125 $f_{samp}$, so that the two signals never overlap on the frequency axis. Because one (one cycle of) multiplexing process itself is equivalent to an existing method, detailed explanations thereof will be omitted.

A demultiplexing process and a multiplexing process performed when a relay device including the digital demultiplexing device and the digital multiplexing device performs a relay process is specifically explained.

Figure 10:
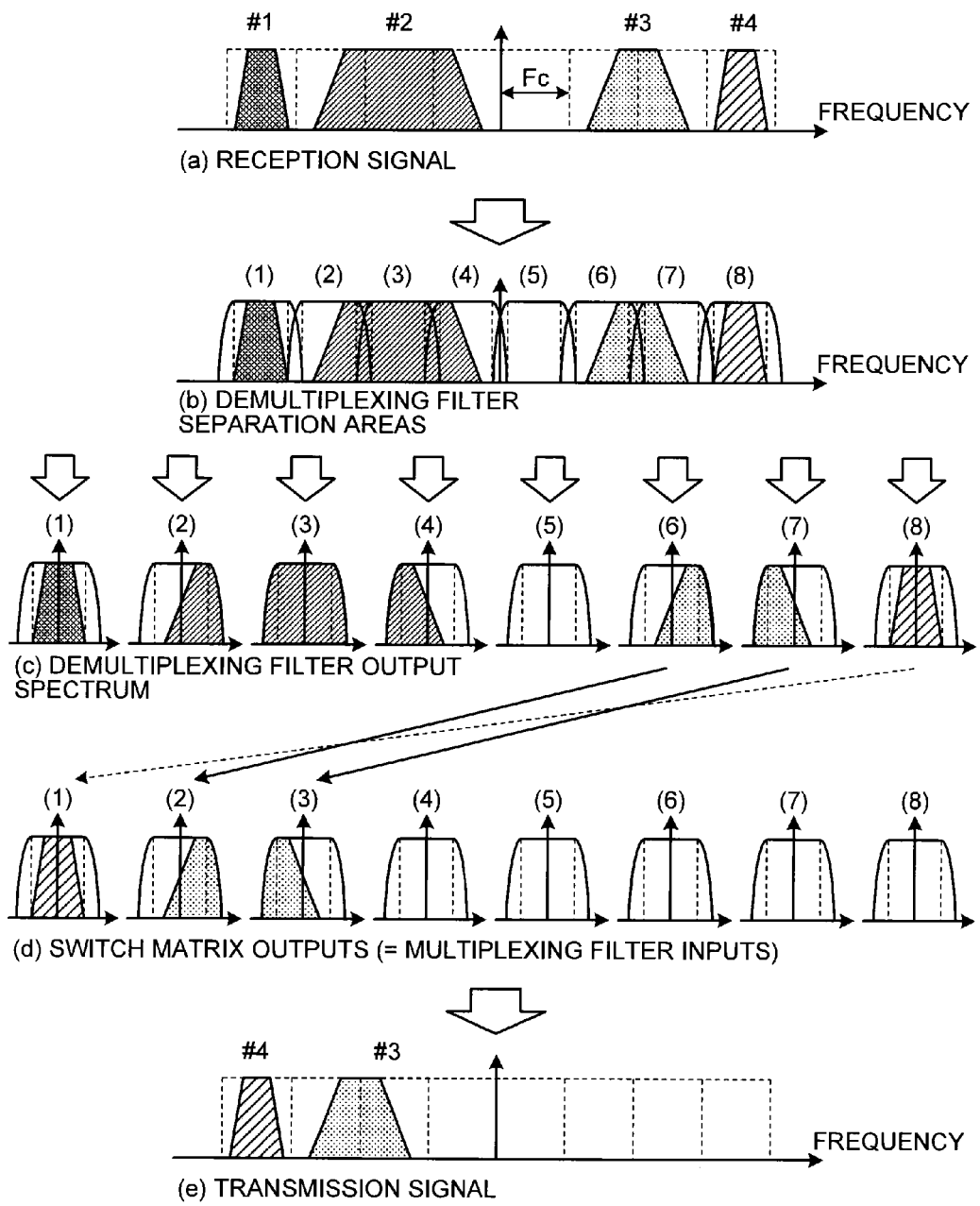
FIG. 10 depicts a demultiplexing/multiplexing process.

The demultiplexing process in the relay process is explained first. FIG. 10 depicts a demultiplexing/multiplexing process. In this case, there are signals #1 to #4 with different bands as shown in (a) in FIG. 10. The bands of the signals #1 and #4 have the minimum signal bandwidths (Bw) and are contained in the minimum channel width (Fc) as shown in (a) in FIG. 10. The band of the signal #3 is 2Bw and the band of the signal #2 is 3Bw. There is an unused area corresponding to the minimum channel width (Fc) between the signals #2 and #3, and a system bandwidth is 8Fc in total including the unused area.

The A/D converting unit 11 first samples the signals (the band: 8Fc) shown in (a) in FIG. 10 at a sampling rate of 32Fc. The frequency-conversion and reception low-pass-filter unit 101 extracts "the unused area, the signal #3, and the signal #4" and the frequency-conversion and reception low-pass-filter unit 102 extracts "the signal #1 and the signal #2" according to the operation shown in FIG. 3.

Similarly, the following frequency-conversion and reception low-pass-filter units 103 to 114 perform staged signal demultiplexing on 1:2 basis. When demultiplexing areas for the demultiplexing filters are denoted by (1) to (8) (eight areas in total) as shown in (b) in FIG. 10, target areas to be extracted by the respective frequency-conversion and reception low-pass-filter units are shown in FIG. 11. FIG. 11 depicts extraction target areas of the respective frequency-conversion and reception low-pass-filter units. FIG. 11 includes the stage, the frequency-conversion and reception low-pass-filter unit, and an extraction area, in which extraction areas covered by the frequency-conversion and reception low-pass-filter units at the respective stages are shown.

As can be understood also from FIG. 11, the demultiplexing process is performed in a tournament (tree) method in which the extraction areas are divided into two with increase in the number of stages. Practically, some signal components on the right and left of each extraction area shown in FIG. 11 are also extracted and accordingly the reception channel-filter units 121 to 128 extract only desired areas while waveform-shaping the signals from the frequency-conversion and reception low-pass-filter units 107 to 114 at stage 3 according to the amplitude-frequency characteristic (A(f)) mentioned above. (c) in FIG. 10 represents a signal spectrum after extraction by the channel filter units 121 to 128. As can be understood from (c) in FIG. 10, the signal #2 is separated into three ((2), (3), and (4)), and the signal #3 is separated into two ((6) and (7)).

In view of the property of demultiplexing a signal into two while reducing the sampling rate to half with each stage passage, the frequency-conversion and reception low-pass-filter units can be operated in a time-division manner in units of stages. In this case, the frequency-conversion and reception low-pass-filter units corresponding to the number of stages (three in the present embodiment) are provided.

The multiplexing process in the relay process is explained next. The non-regenerative switch-matrix unit 15 receives the signals extracted by the reception channel-filter units 121 to 128, selects some or all of the signals, changes arrangement in the frequency direction, and outputs the processed signals. In the example shown in (d) in FIG. 10, the non-regenerative switch-matrix unit 15 selects the signals in the areas (6), (7), and (8) corresponding to the signals #4 and #3, rearranges the signals in such a manner that the area (8) is located in the area (1), the area (6) is located in the area (2), and the area (7) is located in the area (3) ((8)→(1), (6)→(2), and (7)→(3)), and outputs the rearranged signals. No signal is input in the remaining other output areas ((4), (5), (6), (7), and (8)). This operation performed by the non-regenerative switch-matrix unit 15 is controlled by the filter-bank control unit 13.

The filter-bank control unit 13 outputs a clock control signal to the reception-clock control unit 14 and the transmission-clock control unit 33 and a route setting signal to the non-regenerative switch-matrix unit 15, respectively, based on the channel information estimated from the reception signal and obtained from a ground station through another line.

The transmission channel-filter units 301 to 308 shown in FIG. 6 are required when the reception channel-filter units 121 to 128 are not mounted on the digital demultiplexing unit 12, and perform signal waveform shaping and extraction according to the same frequency characteristic as that of the reception channel-filter units 121 to 128. That is, in the process of relaying the signals, positions of the channel filters can be either in the digital demultiplexing unit 12 or in the digital multiplexing unit 34.

As a measure to reduce the circuit scale, both of the channel filter units 121 to 128 in the digital demultiplexing unit 12 and the channel filter units 301 to 308 in the digital multiplexing unit 34 can be used and configured in such a manner that a product of both of the frequency characteristics has the characteristic A(f) mentioned above (for example, the characteristic shown the expressions (1) to (3)). In this case, the circuit scale can be reduced because the number 2m of taps (stages) required in a case where a target attenuation characteristic is realized by two channel filters is smaller than the number M of taps (stages) required in a case where the target attenuation characteristic is realized by one channel filter (M>2m).

The multiplexing process is then performed in stages by the transmission low-pass-filter and frequency-converting units 311 to 324 and the adders 331 to 337 according to the operation shown in FIG. 5.

When signal areas for multiplexing are denoted by (1) to (8) (eight areas in total) as shown in (d) in FIG. 10, targets areas to be multiplexed by the transmission low-pass-filter and frequency-converting units 311 to 324 and the adders 331 to 337 are shown in FIG. 12. FIG. 12 depicts multiplexing target areas of the transmission low-pass-filter and frequency-converting units 311 to 324 and the adders 331 to 337. FIG. 12 includes the stage, the transmission low-pass-filter and frequency-converting unit, the adder, and the multiplexing target area, in which multiplexing target areas covered by the transmission low-pass-filter and frequency-converting units and the adders at the respective stages are shown. In the multiplexing process, the stages are referred to as stage 1, stage 2, and stage 3 starting from one closest to the D/A converting unit 35 (downstream side).

As can be understood also from FIG. 12, the multiplexing process is performed in a tournament (tree) method in which multiplexing areas are doubled with decrease in the number of stages.

(e) in FIG. 10 represents a signal spectrum output from the adder 337. A component (1) of the signal #4 and one component (2) of those of the signal #3 pass through the transmission low-pass-filter and frequency-converting unit 318 and the transmission low-pass-filter and frequency-converting unit 317, respectively, then are synthesized by the adder 334, and are input to the transmission low-pass-filter and frequency-converting unit 322. The other component (3) of the signal #3 passes through the transmission low-pass-filter and frequency-converting unit 316, the adder 333, and the transmission low-pass-filter and frequency-converting unit 321, and then is added by the adder 336 with an output from the transmission low-pass-filter and frequency-converting unit 322 to reconstruct the signal #3, thereby generating multiplexed signals corresponding to the two signals. The multiplexed signals further pass through the transmission low-pass-filter and frequency-converting unit 324 and the adder 337, thereby generating an output signal spectrum shown in (e) in FIG. 10.

The D/A converting unit 35 then performs digital/analog conversion of the multiplexed signal from the adder 337 and outputs the converted signal.

Because no signal passes through the transmission low-pass-filter and frequency-converting units 311, 312, 313, 314, 315, 319, 320, and 323 and the adders 331, 332, and 335 in the multiplexing process described above as is obvious from the process, clock supply to these circuits can be stopped.

Therefore, the transmission-clock supply unit 33 stops the clock supply to these circuits according to the clock control signal from the filter-bank control unit 13. In this way, when the entire signal bandwidth as the multiplexing target is a part of the system band, power consumption can be reduced by stopping the clock supply.

When the entire signal bandwidth as the multiplexing target is increased and approaches the system band, circuits to which the clock supply can be stopped are decreased and therefore the effect of reduction in the power consumption is reduced. However, when beam areas of a multi-beam satellite normally use seven frequency bands repeatedly and one-seventh of a system band is a target of multiplexing in each beam area, clock supply to about six-sevenths of circuits can be stopped and accordingly power consumption of the digital multiplexing unit 34 can be reduced to one-seventh.

Figure 13:
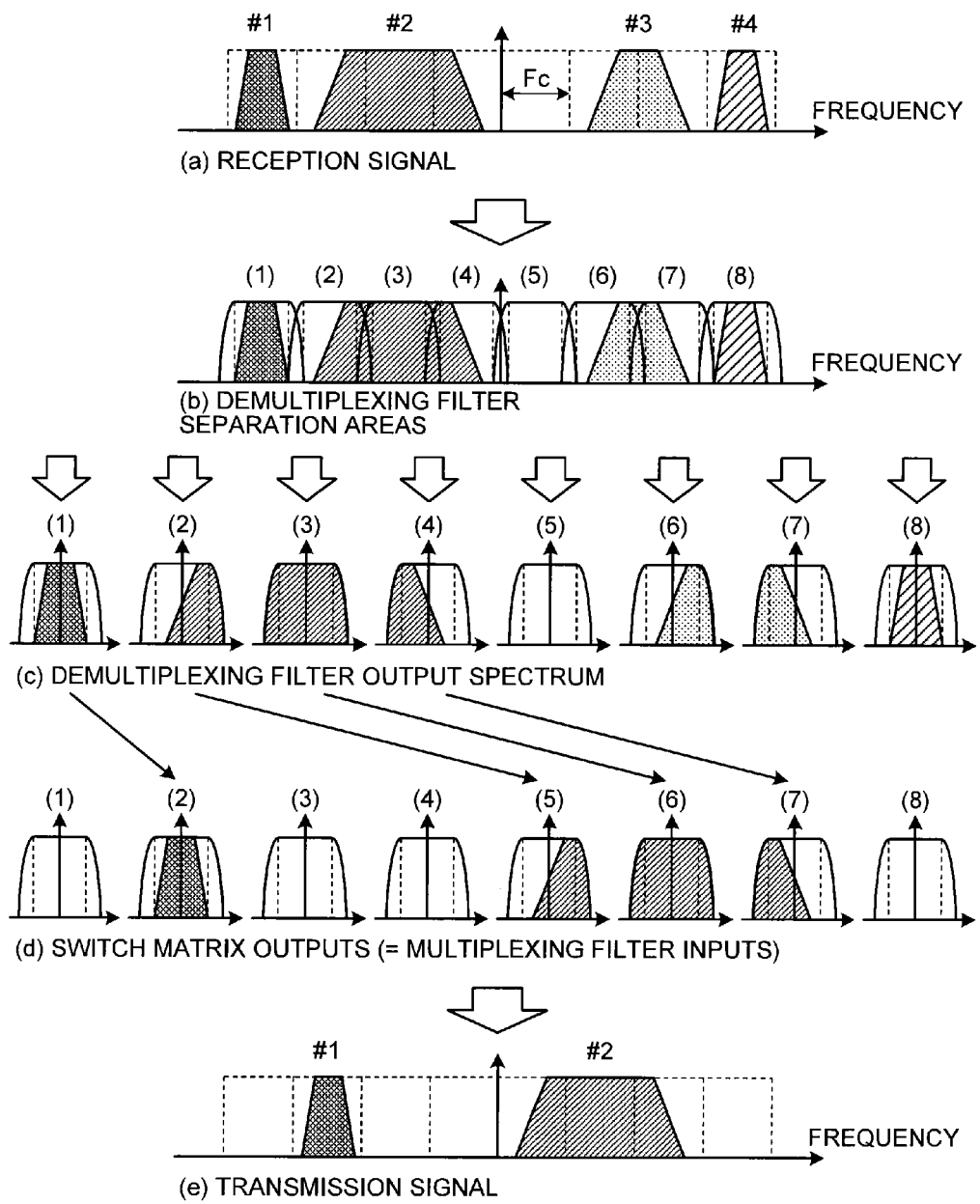
FIG. 13 depicts a demultiplexing/multiplexing process.

FIG. 13 is another example of a demultiplexing/multiplexing process. FIG. 13 is different from FIG. 10 in the multiplexing process. The non-regenerative switch-matrix unit 15 selects areas ((1), (2), (3), and (4)) corresponding to the signals #1 and #2 from the signals extracted by the channel filter units 121 to 128, and rearranges the areas in the frequency direction ((1)→(2), (2)→(5), (3)→(6), and (4)→(7)) at the time of multiplexing input. The signal #2 separated into three is reconstructed by the adder 335 at stage 2 and is synthesized with the signal #1 by the adder 337, thereby generating a multiplexed signal shown in (e) in FIG. 13. In this case, no signal passes through the transmission low-pass-filter and frequency-converting units 311, 315, 316, 318, and 321 and the adder 333 and thus clock supply to these circuits can be stopped. Accordingly, the transmission-clock supply unit 33 stops the clock supply to these circuits according to the clock control signal from the filter-bank control unit 13.

It is not always necessary to reconstruct the original signal #2 during the process of multiplexing. For example, when there are no three adjoining unused bands on the transmission side but three unused bands are scattered, the demultiplexed signal #2 ((2), (3), and (4) in (c) in FIG. 13) can be transmitted to the three scattered unused bands. In this case, demultiplexing/multiplexing is performed in a similar configuration on the side of a receiving apparatus to reconstruct the signal #2. In this way, frequencies can be more effectively used.

While it has been explained that the reduction in power consumption is achieved by stopping the clock supply when the entire signal bandwidth as a multiplexing target is a part of the system band, reduction in power consumption during demultiplexing can be achieved similarly by stopping clock supply when an entire signal bandwidth as a demultiplexing target is a part of the system band.

In this case, the reception-clock supply unit 14 stops clock supply to circuits (the frequency-conversion and reception low-pass-filter units and the reception channel-filter units) through which no signal passes in the digital demultiplexing unit 12 based on the clock control signal from the filter-bank control unit 13.

Specifically, in the examples shown in FIGS. 10 and 13, the unused band is distributed to the frequency-conversion and reception low-pass-filter unit 110 after passing through the frequency-conversion and reception low-pass-filter units 101 and 104 together with other signals. Because the frequency-conversion and reception low-pass-filter unit 110 does not need to perform processing, the reception-clock supply unit 14 can stop clock supply to the frequency-conversion and reception low-pass-filter unit 110. Clock supply to the reception channel-filter unit 124 connected to the frequency-conversion and reception low-pass-filter unit 110 can be also stopped.

While an operation of relaying demultiplexed signals without being demodulated has been explained, the present embodiment can be applied to a case of regenerative relay in which a signal is demodulated and relayed. For example, as shown in FIG. 1, demodulation and decoding for different band signals can be easily achieved only by selecting regenerative relay signals from the signals during demultiplexing with the selector unit 16 and then performing a demodulating and decoding process for the selected signals with the demodulating and decoding unit 17. When demodulated and decoded data with plural rates for which routes are set by the regenerative switch-matrix unit 18 are re-modulated, multiplexing of different band signals can be easily achieved only by distributing with the selector unit 32 signals coded and modulated by the coding and modulating unit 31 to inputs of the transmission low-pass-filter and frequency-converting units at the respective stages, as shown in FIG. 6. With this sequence of processes, the regenerative relay of the different band signals can be easily realized.

As described above, in the present embodiment, no clock is supplied to circuits that perform processing of bands through which no signal passes, to stop the circuits during the process in which the digital demultiplexing device performs demultiplexing. This enables to realize demultiplexing of plural signals having various bandwidths while also realizing reduction in power consumption. Furthermore, no clock is supplied to circuits that perform processing of bands through which no signal passes, to stop the circuits during the process in which the digital multiplexing device performs multiplexing. This enables to realize multiplexing of plural signals having various bandwidths while also realizing reduction in power consumption.

While a case where the relay device has the digital demultiplexing device and the digital multiplexing device mounted thereon has been explained as a specific example, the present embodiment is not limited thereto. For example, the present embodiment can be applied also to a wireless communication device having the digital demultiplexing device and the digital multiplexing device or either of the devices mounted thereon. The present embodiment can be applied also to a wireless communication system including a plurality of wireless communication devices each having the two devices mounted thereon, or a wireless communication system including a wireless communication device having the digital demultiplexing device mounted thereon and a wireless communication device having the digital multiplexing device mounted thereon.

When a signal is demultiplexed by the demultiplexing device into signals corresponding to $2^N$ waves (N=the number of stages: N is a natural number equal to or larger than one), the number of the frequency-conversion and reception low-pass-filter units at an Mth stage ($1 \leq M \leq N$) needs to be $2^M$ and the total number thereof in the digital demultiplexing unit 12 needs to be $2^{N+1}-2$ in the tournament (tree) method shown in FIG. 1. The total number of the reception channel-filter units in the digital demultiplexing unit 12 needs to be $2^N$.

When input signals corresponding to $2^N$ waves (N=the number of stages: N is a natural number equal to or larger than one) are multiplexed by the multiplexing device, the number of the transmission low-pass-filter and frequency-converting units at an Mth stage ($1 \leq M \leq N$) needs to be $2^{(N-M+1)}$ and the total number thereof in the digital multiplexing unit 34 needs to be $2^{N+1}-2$ in the tournament (tree) method shown in FIG. 6. The total number of the adders in the digital multiplexing unit 34 needs to be $2^N-1$.

Second Embodiment

In a second embodiment of the present invention, a demultiplexing device, a multiplexing device, and a relay device including the demultiplexing device and the multiplexing device, which can enhance flexibility in frequency allocation (enhance use efficiency of frequencies) for each carrier when a signal is demultiplexed and demodulated or signals are modulated and multiplexed, in addition to the effect of reduction in power consumption in the first embodiment, are explained. Parts different from the first embodiment are explained.

Figure 14:
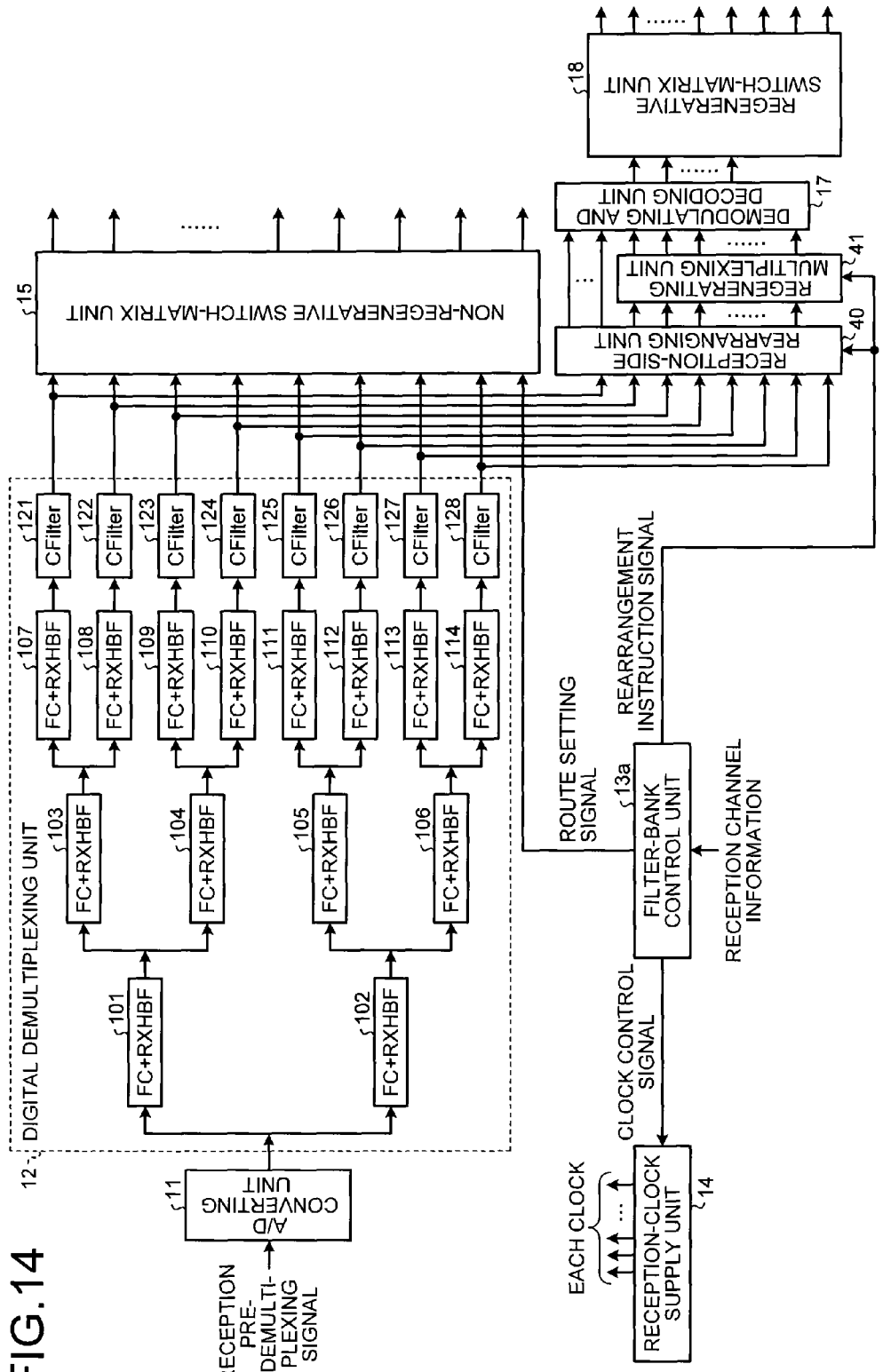
FIG. 14 is a configuration example of a digital demultiplexing device.

FIG. 14 is a configuration example of a digital demultiplexing device according to the present embodiment. The present embodiment is different from the first embodiment (see FIG. 1) in including a filter-bank control unit 13a instead of the filter-bank control unit 13 and a reception-side rearranging unit 40 and a regenerating multiplexing unit 41 instead of the selector unit 16. The filter-bank control unit 13a controls operations of constituent elements based on the reception channel information. In the present embodiment, the filter-bank control unit 13a generates a rearrangement instruction signal based on the channel information estimated from the reception signal and obtained from the ground station through another line, and outputs the generated signal to the reception-side rearranging unit 40 and the regenerating multiplexing unit 41. The reception-side rearranging unit 40 rearranges signals output from the digital demultiplexing unit 12 based on the rearrangement instruction signal from the filter-bank control unit 13a. The regenerating multiplexing unit 41 multiplexes signals input from the reception-side rearranging unit 40 based on the rearrangement instruction signal from the filter-bank control unit 13a.

The rearrangement instruction signal is for rearranging input signals in the frequency direction according to bandwidths and arrangement of the signals so that demultiplexing or multiplexing can be efficiently performed in the digital demultiplexing device or a digital multiplexing device (explained later). Specifically, the signals are arranged to reduce the number of multiplexing processes (explained later) in the digital demultiplexing device or reduce the number of demultiplexing processes (explained later) in the digital multiplexing device.

In the digital demultiplexing device according to the first embodiment (see FIG. 1), the demultiplexing is performed in a flow of extracting signals during the process of demultiplexing performed in the digital demultiplexing unit 12 and then inputting the extracted signals to the demodulating and decoding unit 17, as described above. Specifically, a signal with a bandwidth of 4Fc can be extracted from the outputs at stage 1 (the frequency-conversion and reception low-pass-filter units 101 and 102) and a signal with a bandwidth of 2Fc can be extracted from the outputs at stage 2 (the frequency-conversion and reception low-pass-filter units 103, 104, 105, and 106). However, due to the signal processing in which one signal is divided into two in stages, there are cases where the extraction cannot be performed depending on signal frequency allocation.

For example, when bands of an input signal are 0 to 8Fc (a bandwidth is 8Fc), the frequency-conversion and reception low-pass-filter unit 101 extracts bands of 4Fc to 8Fc and the frequency-conversion and reception low-pass-filter unit 102 extracts bands of 0 to 4Fc at stage 1. At that time, when allocated frequencies to a signal with a bandwidth of 4Fc are either 0 to 4F or 4Fc to 8Fc, the signal can be extracted, demodulated, and decoded with the configuration according to the first embodiment.

Figure 15:
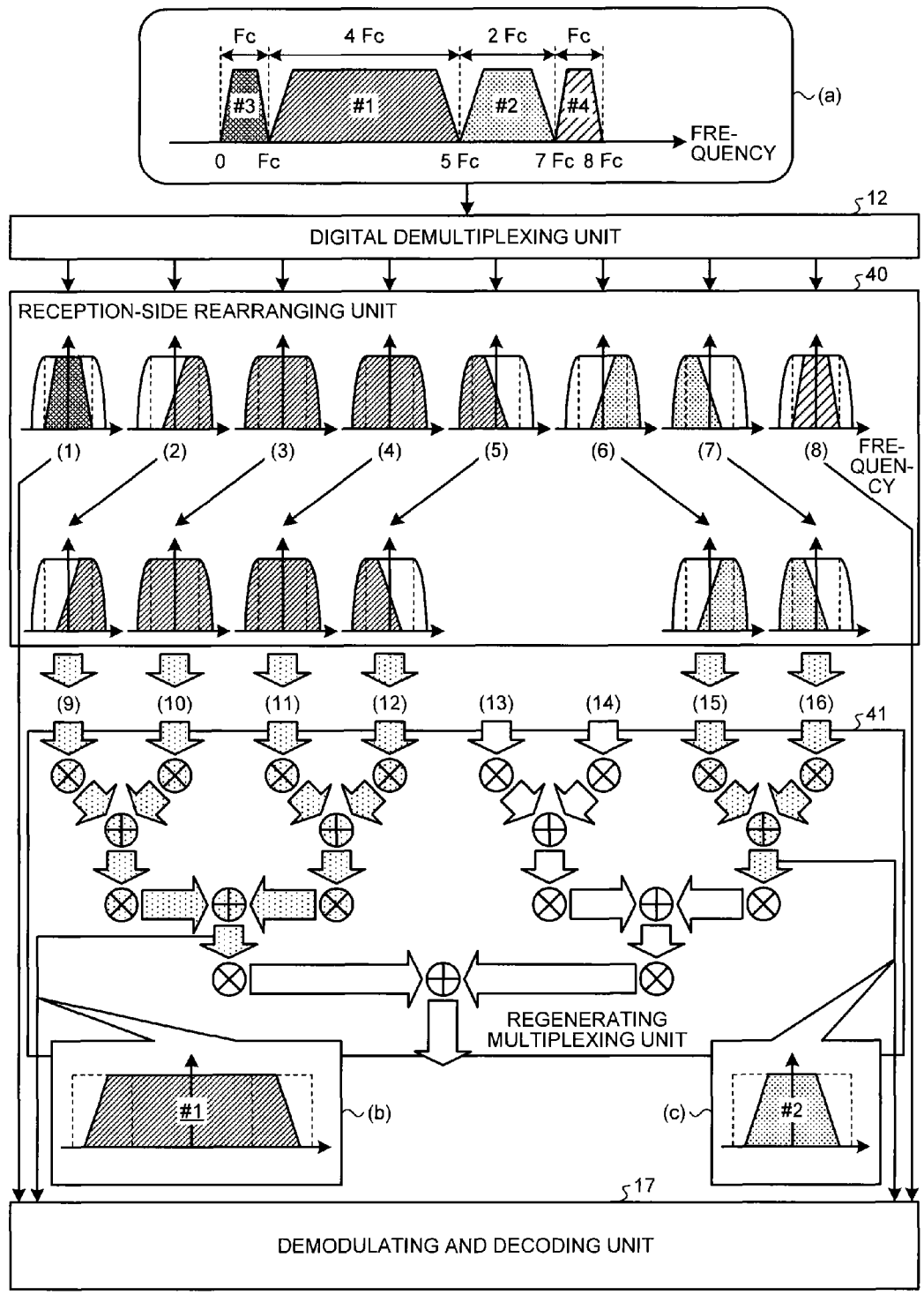
FIG. 15 depicts processes from a digital demultiplexing process to a demodulating and decoding process.

However, when allocated frequencies to the signal with the bandwidth of 4Fc are Fc to 5Fc as shown by a signal #1 in (a) in FIG. 15, the signal #1 is divided to 3:1 and accordingly a normal demodulation and decoding result cannot be obtained even when either of the outputs from the frequency-conversion and reception low-pass-filter units 101 and 102 is extracted. Similarly, when extraction is performed at stage 2, a signal #2 (frequency position: 5Fc to 7Fc) shown in (a) in FIG. 15 is also divided to 1:1 and accordingly a normal demodulation and decoding result cannot be obtained.

For the same reason, also in the digital multiplexing device according to the first embodiment (see FIG. 6), frequency allocation to coded and modulated signals is restricted. For example, frequencies to be allocated to a signal with a bandwidth of 4Fc are selected from 0 to 4Fc and 4Fc to 8Fc. That is, in the first embodiment, there is no restriction on frequency allocation to signals but arbitrary frequency allocation is realized in a non-regenerative relay path while restriction needs to be set on frequency allocation to signals in a regenerative relay path that performs processes such as demodulation and decoding or coding and modulation.

In the present embodiment, the restriction on the frequency allocation to signals is eliminated to realize arbitrary frequency allocation even in a regenerative relay path that performs processes such as demodulation and decoding or coding and modulation.

The digital demultiplexing device according to the present embodiment is explained with reference to FIGS. 14 and 15. FIG. 15 depicts processes from a digital demultiplexing process to a demodulating and decoding process in the present embodiment. Processes for signals demultiplexed by the digital demultiplexing unit 12 to be performed by the reception-side rearranging unit 40 and the regenerating multiplexing unit 41, which are added in the present embodiment, are shown. As shown in (a) in FIG. 15, a process in which the digital demultiplexing device receives four signals {#1, #2, #3, and #4} and demultiplexes and demodulates the signals is explained.

In the digital demultiplexing device, the digital demultiplexing unit 12 first demultiplexes the signals shown in (a) in FIG. 15 into eight ((1) to (8) in FIG. 15) as in the first embodiment.

The reception-side rearranging unit 40 receives the eight signals (1) to (8), switches the eight signals (1) to (8) based on the rearrangement instruction signal from the filter-bank control unit 13a, and outputs six signals (2) to (7) among these to the regenerating multiplexing unit 41 at the subsequent stage.

Signals with a bandwidth of Fc (signals #3 and #4 in (a) in FIG. 15) can be extracted without demultiplexing the signals. Accordingly, the reception-side rearranging unit 40 outputs the signal #3 (signal (1)) and the signal #4 (signal (8)) with the bandwidth of Fc directly to the demodulating and decoding unit 17 without outputting to the regenerating multiplexing unit 41 at the subsequent stage.

The demodulating and decoding unit 17 demodulates the input signal #3 (signal (1)). Similarly, the demodulating and decoding unit 17 demodulates the input signal #4 (signal (8)).

The reception-side rearranging unit 40 then connects the signal #1 demultiplexed into four signals (2) to (5) to input ports (9) to (12) of the regenerating multiplexing unit 41 and the signal #2 demultiplexed into two signals (6) and (7) to input ports (15) and (16) of the regenerating multiplexing unit 41, respectively, based on the rearrangement instruction signal from the filter-bank control unit 13a. Alternatively, the signal #2 demultiplexed into the two signals (6) and (7) can be input to input ports (13) and (14) of the regenerating multiplexing unit 41, respectively. In this way, the reception-side rearranging unit 40 connects the signals to the input ports that can multiplex the signals effectively (with less times of multiplexing) in the regenerating multiplexing unit 41.

While the regenerating multiplexing unit 41 is shown in a simplified configuration in FIG. 15, it specifically has the same configuration as that of the digital multiplexing unit 34 shown in FIG. 6. Accordingly, an operation of the regenerating multiplexing unit 41 is explained based on the configuration of the digital multiplexing unit 34 shown in FIG. 6.

The regenerating multiplexing unit 41 connects the signals (2) to (5) input through the input ports (9) to (12) to the transmission low-pass-filter and frequency-converting units 318, 317, 316, and 315 in the regenerating multiplexing unit 41 based on the rearrangement instruction signal from the filter-bank control unit 13a. The signals are multiplexed in stages by the multiplexing process by the transmission low-pass-filter and frequency-converting units 318, 317, 316, and 315, the adders 334 and 333, the transmission low-pass-filter and frequency-converting units 322 and 321, and the adder 336, whereby the signal #1 is reconstructed and extracted at an output terminal of the adder 336 ((b) in FIG. 15).

Similarly, the regenerating multiplexing unit 41 connects the signals (6) and (7) input through the input ports (15) and (16) to the transmission low-pass-filter and frequency-converting units 312 and 311 in the regenerating multiplexing unit 41. Subsequently, in the multiplexing process by the transmission low-pass-filter and frequency-converting units 312 and 311 and the adder 331, the signal #2 is reconstructed and extracted at an output terminal of the adder 331 ((c) in FIG. 15). While only two signals are output from the regenerating multiplexing unit 41 to the demodulating and decoding unit 17 in FIG. 15, a plurality of signals can be output from the regenerating multiplexing unit 41 to the demodulating and decoding unit 17 as shown in FIG. 14. Specifically, the regenerating multiplexing unit 41 can output signals multiplexed at respective stage.

In this way, the digital demultiplexing device according to the present embodiment can extract the signals #1 and #2 and the demodulating and decoding unit 17 can demodulate the reconstructed baseband signals.

When the demodulated and decoded signals are to be relayed, demodulated and decoded data are transmitted to the digital multiplexing device as a relay destination through the regenerative switch-matrix unit 18 as in the first embodiment.

The regenerative switch-matrix unit 18 can be controlled according to a signal from the filter-bank control unit 13a based on the reception channel information from the ground station. Alternatively, a beam or a downlink frequency of a relay destination can be previously written in header information of the demodulated and decoded data, and the regenerative switch-matrix unit 18 can analyze the header information of the data, thereby specifying the beam or the downlink frequency of the relay destination of each data to perform a self-reliant switching operation. When the regenerative switch-matrix unit 18 performs the self-reliant switching, frequency utilization manners can be finely changed at a shorter time interval, which increases a system capacity.

In this way, the reception-side rearranging unit 40 rearranges the input signals and the regenerating multiplexing unit 41 performs the multiplexing process for the rearranged signals. This enables to realize simultaneous demultiplexing and demodulation for the bandwidth of 4Fc (the signal #1: frequency position of 1Fc to 5Fc) and for the bandwidth of 2Fc (the signal #2: frequency position of 5Fc to 7Fc) and increase frequency use efficiency.

Figure 16:
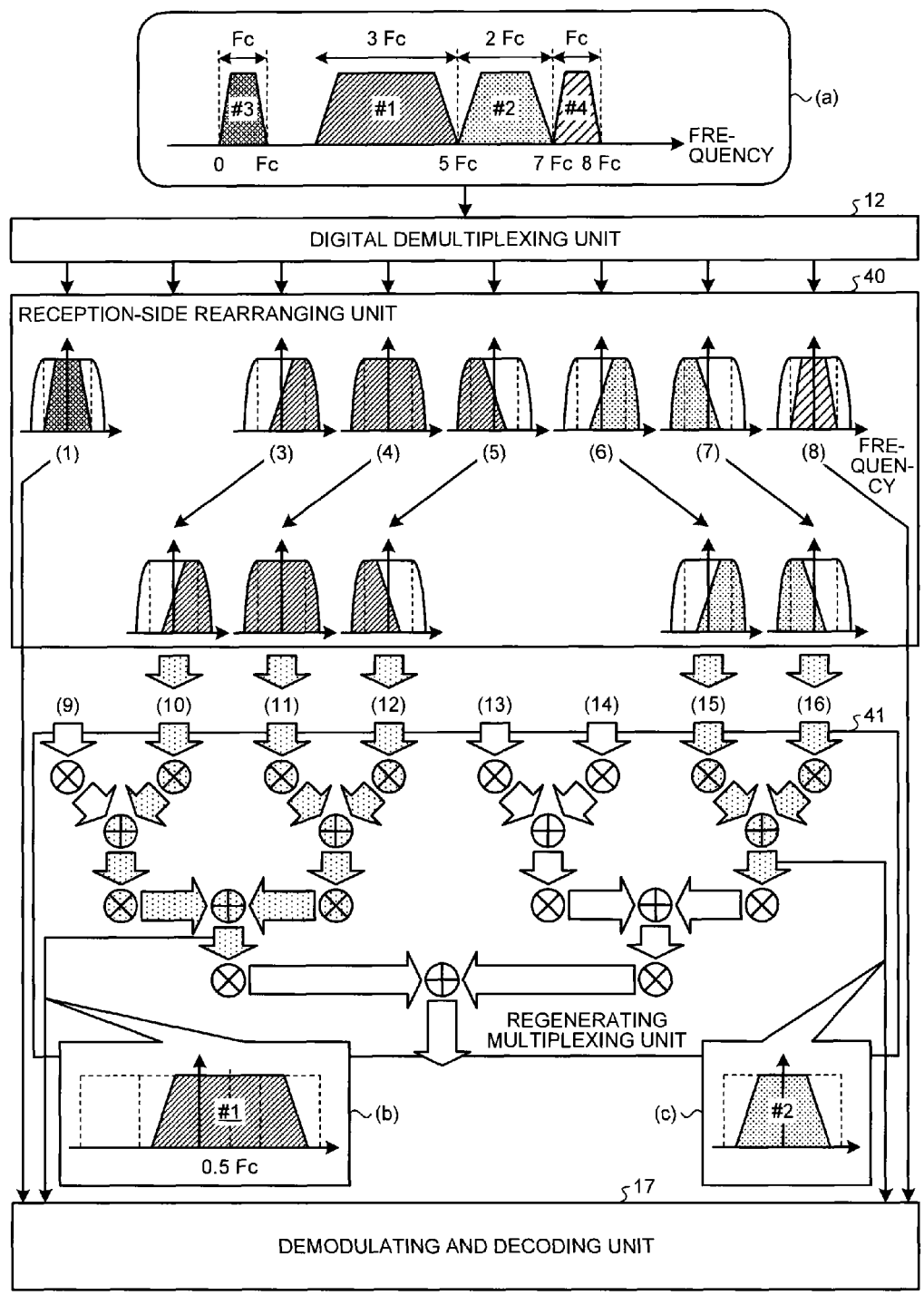
FIG. 16 depicts processes from a digital demultiplexing process to a demodulating and decoding process.

While the process of simultaneous demultiplexing and demodulation for the bandwidth of 4Fc (the signal #1) and for the bandwidth of 2Fc (the signal #2) has been explained in the present embodiment, the present embodiment is not limited thereto and the simultaneous demultiplexing and demodulation can be performed for signals as long as the signals have bandwidths as large as integer multiples of Fc. FIG. 16 depicts processes from a digital demultiplexing process to a demodulating and decoding process in the present embodiment. Processes for the signals demultiplexed by the digital demultiplexing unit 12 to be performed by the reception-side rearranging unit 40 and the regenerating multiplexing unit 41 added in the present embodiment are shown.

For example, in the case of a signal with a bandwidth of 3Fc, the digital demultiplexing unit 12 demultiplexes the signal into three signals, and, as shown in FIG. 16, the three demultiplexed signals (the original signal #1) can be connected to input ports (10) to (12) in FIG. 16, so that the signal with the bandwidth of 3Fc can be extracted at the output terminal of the adder 336. While a central frequency is offset to +0.5Fc as shown in (b) in FIG. 16, the frequency offset can be eliminated by the demodulating and decoding unit 17 at the subsequent stage. The frequency offset occurs not only when the bandwidth is 3Fc but also the bandwidth is an odd multiple of Fc, such as {3, 5, 7, . . . } times as large as Fc.

Occurrence of the frequency offset can be prevented by the following process. This eliminates the need of the frequency offset process in the demodulating and decoding unit 17 at the subsequent stage. Specifically, in FIG. 16, the signals (3) to (5) input through the input ports (10) to (12) of the regenerating multiplexing unit 41 are connected to the transmission low-pass-filter and frequency-converting units 318, 317, 316, and 315 in the regenerating multiplexing unit 41 and, during a staged multiplexing process performed by the transmission low-pass-filter and frequency-converting units 318, 317, 316, and 315, the adders 333 and 334, the transmission low-pass-filter and frequency-converting units 322 and 321, and the adder 336, respective amounts of frequency conversion performed in the transmission low-pass-filter and frequency-converting units 322 and 321 at the last stage are changed to obtain a central frequency of zero after multiplexing.

While the frequency converting unit 21 in the transmission low-pass-filter and frequency-converting units normally performs frequency shift of $\pm 0.125\, f_{samp}$ as explained in the first embodiment, the transmission low-pass-filter and frequency-converting unit 322 performs frequency shift of $-3\, f_{samp}/16$ or the transmission low-pass-filter and frequency-converting unit 321 performs frequency shift of $+f_{samp}/16$ in the case shown in FIG. 16. This enables the digital demultiplexing device to reconstruct the signal #1 output from the adder 336 without frequency offset.

Figure 17:
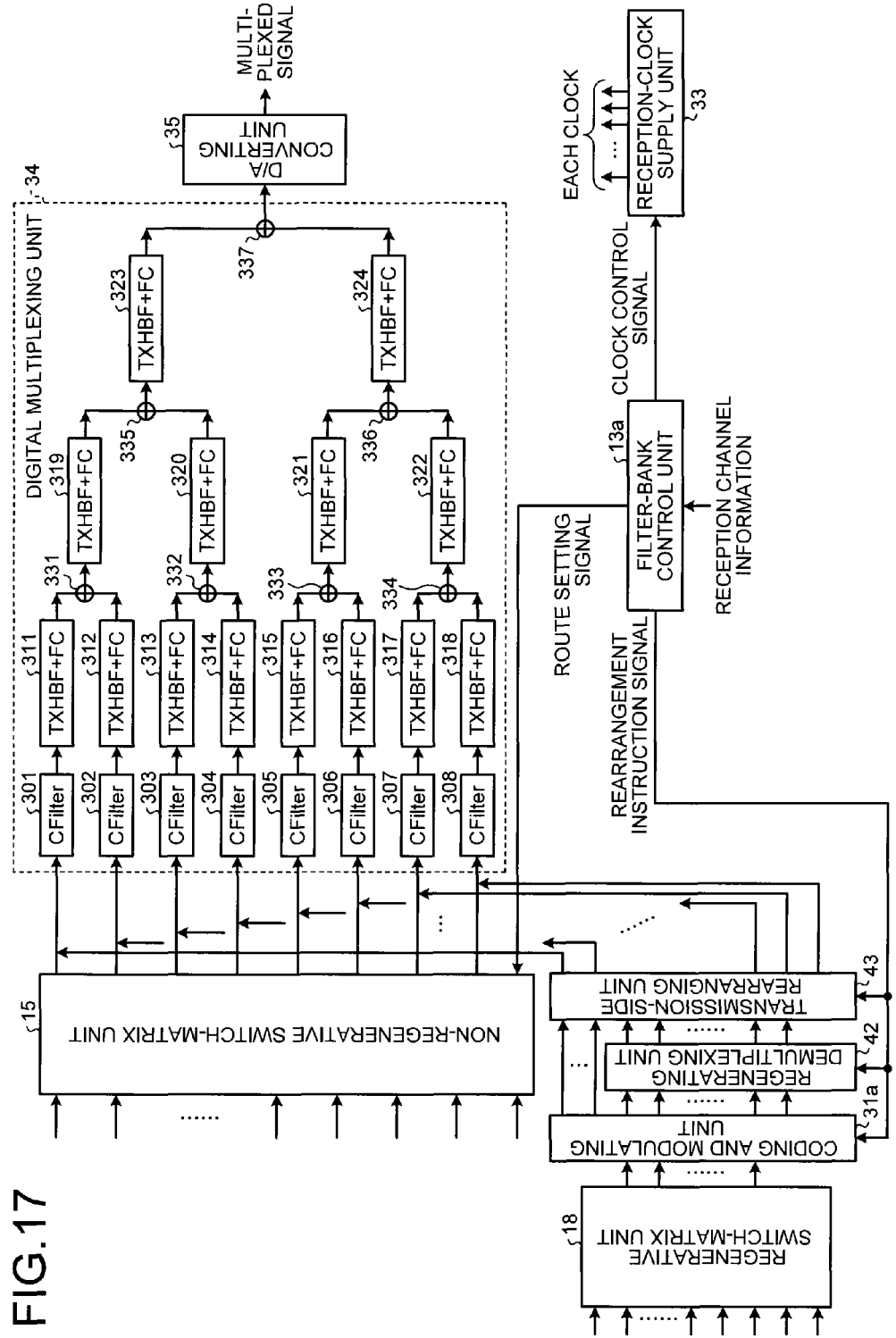
FIG. 17 is a configuration example of the digital multiplexing device.

The digital multiplexing device according to the present embodiment is explained next. FIG. 17 is a configuration example of the digital multiplexing device according to the present embodiment. The present embodiment is different from the first embodiment (see FIG. 6) in including the filter-bank control unit 13a instead of the filter-bank control unit 13, a coding and modulating unit 31a instead of the coding and modulating unit 31, and a regenerating demultiplexing unit 42 and a transmission-side rearranging unit 43 instead of the selector unit 32. The filter-bank control unit 13a controls operations of constituent elements based on the reception channel information. In the present embodiment, the filter-bank control unit 13a generates a rearrangement instruction signal based on the channel information estimated from the reception signal and obtained from the ground station through another line and outputs the generated signal to the coding and modulating unit 31a, the regenerating demultiplexing unit 42, and the transmission-side rearranging unit 43. The coding and modulating unit 31a determines output destinations of signals based on the rearrangement instruction signal from the filter-bank control unit 13a. The regenerating demultiplexing unit 42 demultiplexes the signals output from the coding and modulating unit 31a based on the rearrangement instruction signal from the filter-bank control unit 13a. The transmission-side rearranging unit 43 rearranges the signals output from the coding and modulating unit 31a and the signals output from the regenerating demultiplexing unit 42 based on the rearrangement instruction signal from the filter-bank control unit 13a.

Figure 18:
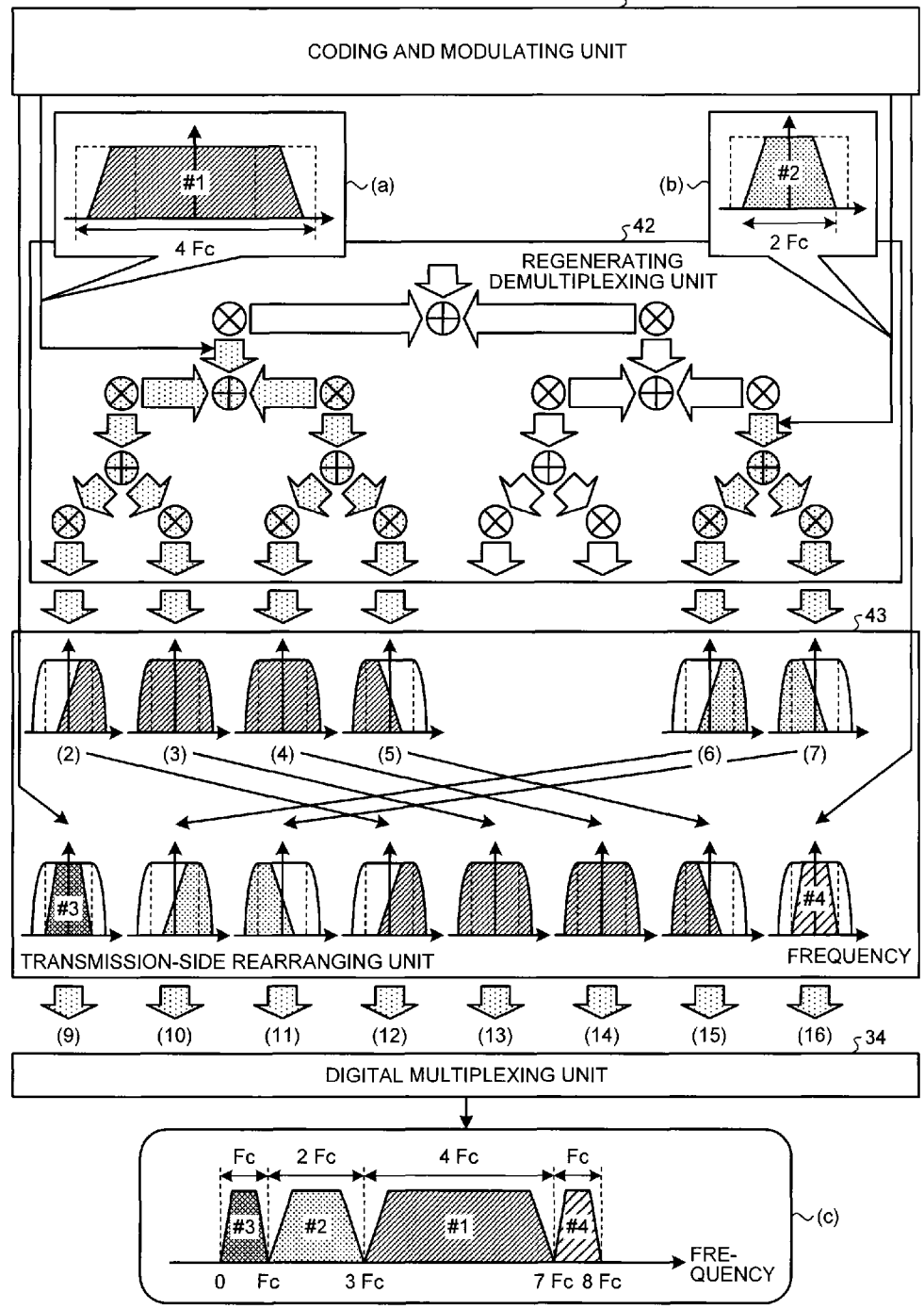
FIG. 18 depicts processes from a coding and modulating process to a demodulating and decoding process.

FIG. 18 depicts processes from a coding and modulating process to a demodulating and decoding process according to the present embodiment. Processes performed by the digital multiplexing device to modulate and multiplex four signals {#1, #2, #3, and #4} and finally transmit the signals according to signal allocation shown in (c) in FIG. 18 are shown. In the signal allocation shown in (c) in FIG. 18, the coded and modulated signal #1 with a bandwidth of 4Fc is allocated to 3Fc to 7Fc and the coded and modulated signal #2 with a bandwidth of 2Fc is allocated to Fc to 3Fc. This allocation cannot be realized by the digital multiplexing device according to the first embodiment, which multiplexes two signals from the coding and modulating unit 31a into one in stages, respectively. The present embodiment is not limited to this allocation and the signals can be output according to the same allocation as shown in (a) in FIG. 15.

The digital multiplexing device according to the present embodiment is explained with reference to FIGS. 17 and 18. The coding and modulating unit 31a first generates a baseband signal #1 (the bandwidth of 4Fc) shown in (a) in FIG. 18, a baseband signal #2 (the bandwidth of 2Fc) shown in (b) in FIG. 18, a baseband signal #3 (the bandwidth of Fc), and a baseband signal #4 (the bandwidth of Fc). The coding and modulating unit 31a outputs the signals #3 and #4 with the bandwidth of Fc, which can be input to the transmission channel-filter units 301 to 308 in the digital multiplexing unit 34 at the subsequent stage, to the transmission-side rearranging unit 43, and outputs the signals #1 and #2 that are larger than the bandwidth of Fc to demultiplexing positions in which the regenerating demultiplexing unit 42 can perform demultiplexing effectively (with less times of processing).

While the regenerating demultiplexing unit 42 is shown in a simplified configuration in FIG. 18, it has specifically the same configuration as that of the digital demultiplexing unit 12 shown in FIG. 1. Accordingly, an operation of the regenerating demultiplexing unit 42 is explained based on the configuration of the digital demultiplexing unit 12 shown in FIG. 1.

The regenerating demultiplexing unit 42 inputs the signal #1 from the coding and modulating unit 31a, instead of the output from the frequency-conversion and reception low-pass-filter unit 102, to the frequency-conversion and reception low-pass-filter units 105 and 106 based on the rearrangement instruction signal from the filter-bank control unit 13a. The signal #1 is then demultiplexed in stages in a demultiplexing process by the frequency-conversion and reception low-pass-filter units 105, 106, 111, 112, 113, and 114, and the reception channel-filter units 125, 126, 127, and 128 in the regenerating demultiplexing unit 42, and then is output as four demultiplexed signals (2), (3), (4), and (5) from the reception channel-filter units 128, 127, 126, and 125.

Similarly, the regenerating demultiplexing unit 42 inputs the signal #2 from the coding and modulating unit 31a, instead of the output from the frequency-conversion and reception low-pass-filter unit 103, to the frequency-conversion and reception low-pass-filter units 107 and 108. The signal is then demultiplexed in a demultiplexing process by the frequency-conversion and reception low-pass-filter units 107 and 108 and the reception channel-filter units 121 and 122 in the regenerating demultiplexing unit 42, and is output as two demultiplexed signals (6) and (7) from the reception channel-filter units 121 and 122. The regenerating demultiplexing unit 42 can similarly demultiplex the signal #2 from the coding and modulating unit 31a into two signals by alternatively inputting the signal, instead of the output from the frequency-conversion and reception low-pass-filter unit 104, to the frequency-conversion and reception low-pass-filter units 109 and 110.

The transmission-side rearranging unit 43 then connects the signals (2) to (5) (the original signal #1) in FIG. 18 to input ports (12) to (15) of the digital multiplexing unit 34 shown in FIG. 18 and connects the signals (6) and (7) (the original signal #2) in FIG. 18 to input ports (10) and (11) of the digital multiplexing unit 34 shown in FIG. 18, respectively, based on the rearrangement instruction signal from the filter-bank control unit 13a. The transmission-side rearranging unit 43 connects the signal #3 from the coding and modulating unit 31a to an input port (9) of the digital multiplexing unit 34 and connects the signal #4 from the coding and modulating unit 31a to an input port (16) of the digital multiplexing unit 34. The input ports (9), (10), . . . , and (16) of the digital multiplexing unit 34 in FIG. 18 correspond to inputs of the transmission low-pass-filter and frequency-converting units 318, 317, . . . , and 311, respectively.

The digital multiplexing unit 34 multiplexes the signals input through the ports (9), (10), . . . , and (16) in the same manner as in the first embodiment, as shown in FIG. 18. This enables the multiplexed signals to be output according to signal allocation shown in (c) in FIG. 18.

In this way, the coding and modulating unit 31a outputs a coded and modulated signal to a position in which the regenerating demultiplexing unit 42 can perform effective demultiplexing, the regenerating demultiplexing unit 42 demultiplexes the coded and modulated signal, and the transmission-side rearranging unit 43 rearranges the demultiplexed signals and outputs the rearranged signals. This enables to realize simultaneous modulation and multiplexing for the bandwidth of 4Fc (the signal #1: frequency position from 3Fc to 7Fc) and for the bandwidth of 2Fc (the signal #2: frequency position from 1Fc to 3Fc). While only two signals are output from the coding and modulating unit 31a to the regenerating demultiplexing unit 42 in FIG. 18, a plurality of signals can be output from the coding and modulating unit 31a to the regenerating demultiplexing unit 42 as shown in FIG. 17. Specifically, the coding and modulating unit 31 can output signals to pre-demultiplexing positions at each stage in the regenerating demultiplexing unit 42.

As explained above, in the present embodiment, signals are rearranged according to allocation in which simultaneous demultiplexing and demodulation and simultaneous modulation and multiplexing can be performed in a regenerative relay path. Accordingly, restriction on frequency allocation for the respective signals is eliminated and flexibility in the frequency allocation can be enhanced (frequency use efficiency can be enhanced) for each carrier when the signals are demultiplexed and demodulated or modulated and multiplexed.

While the simultaneous modulating and multiplexing process for the bandwidth of 4Fc (signal #1) and for the bandwidth of 2Fc (signal #2) has been explained in the present embodiment, the present embodiment is not limited thereto and when signals have bandwidths as large as integer multiples of Fc, the signals can be simultaneously modulated and multiplexed. For example, when the coding and modulating unit 31a transmits a signal with a bandwidth of 3Fc, the regenerating demultiplexing unit 42 inputs the signal, instead of the output from the frequency-conversion and reception low-pass-filter unit 102, to the frequency-conversion and reception low-pass-filter units 105 and 106 to demultiplex the signal into four signals, and then the transmission-side rearranging unit 43 rearranges the signals according to desired signal allocation and outputs the rearranged signals to the digital multiplexing unit 34, as the signal #1 with the bandwidth of 4Fc. Demultiplexing of the signal with the bandwidth of 3Fc not into the four signals but into three signals in view of efficient use of frequencies also can be realized by changing amounts of frequency conversion performed in the frequency-conversion and reception low-pass-filter units 105 and 106, as in the demultiplexing and demodulating process.

Third Embodiment

In a third embodiment of the present invention, reducing power consumption by further lowering a sampling rate of demultiplexing/multiplexing than that in the first embodiment is explained.

While a case where the signals with a total bandwidth of 8Fc are sampled at the sampling rate of 16Fc has been explained in the first embodiment, the sampling rate of 16Fc can be further lowered by changing setting of the frequency-conversion and reception low-pass-filter units 101 to 114, the transmission low-pass-filter and frequency-converting units 311 to 324, and the reception channel-filter units 121 to 128, while the signal bandwidth of 8Fc is kept. The following three points are changed.

(1) The amounts of frequency conversion by the frequency converting units 21 in the frequency-conversion and reception low-pass-filter units 101 to 114 and the transmission low-pass-filter and frequency converting units 311 to 324.

(2) The frequency characteristics of the low-pass filters 22 and 23 in the frequency-conversion and reception low-pass-filter units 101 to 114 and the transmission low-pass-filter and frequency-converting units 311 to 324.

(3) The frequency characteristic of the reception channel-filter units 121 to 128.

A case where the sampling rate is lowered from 16Fc to 10Fc while the signal bandwidth of 8Fc is kept is specifically explained. The sampling rate is not limited to 10Fc and can have any value as long as it is higher than a signal bandwidth to be processed.

Figure 19:
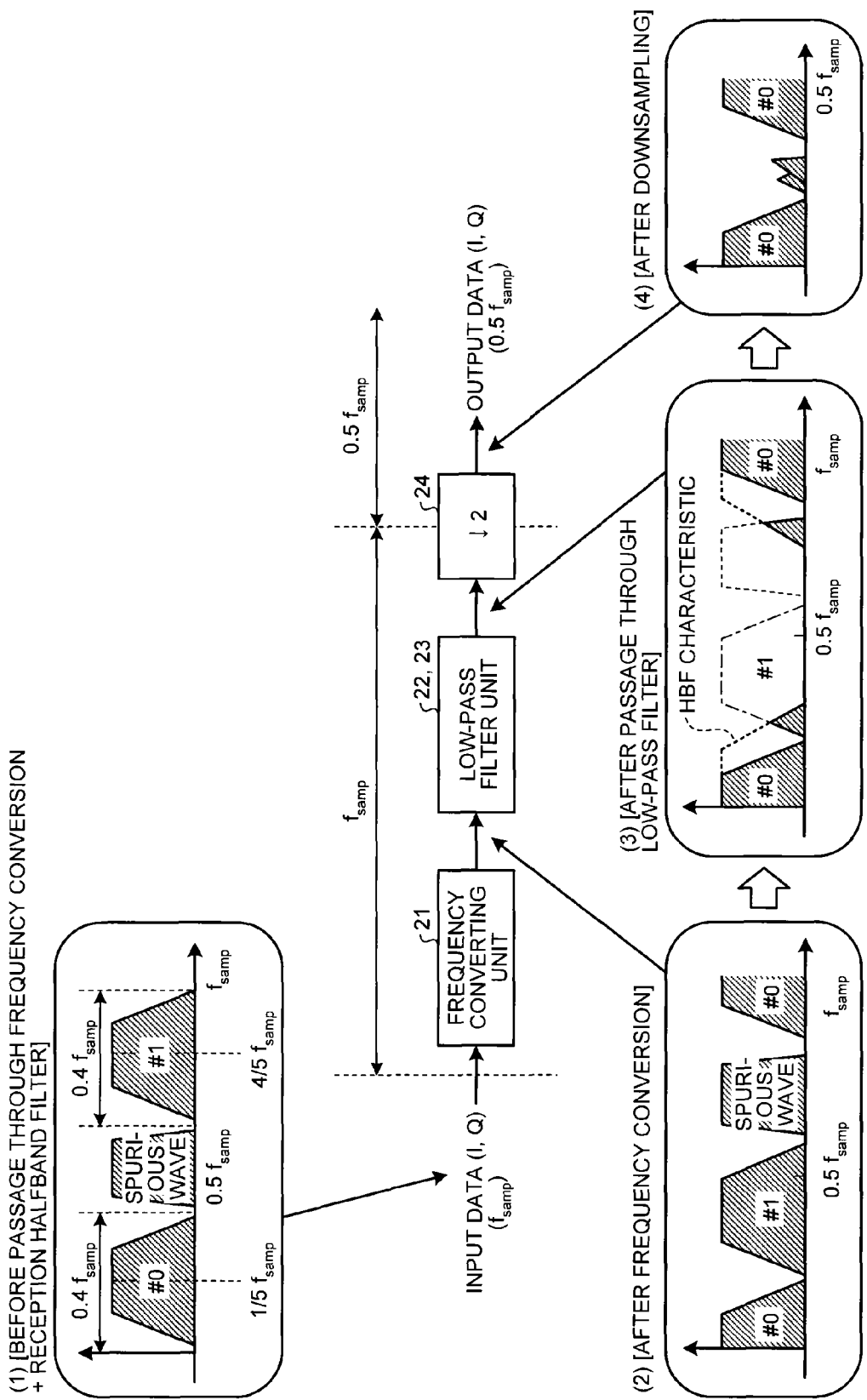
FIG. 19 depicts processes performed by frequency-conversion and reception low-pass-filter units.

FIG. 19 depicts processes performed by the frequency-conversion and reception low-pass-filter units 101 to 114. Because a ratio of the signal bandwidth to the sampling rate is higher than that in the first embodiment, the frequency converting units 21 cannot convert a central frequency of a desired signal to DC with the frequency shift of $\pm 0.125\ f_{samp}$ described in the first embodiment. In the present embodiment, a ratio between a bandwidth of a signal #0 (or #1) and the sampling rate is 2:5 and accordingly a central frequency of the signal #0 (or #1) can be converted to DC by changing the frequency shift to $\pm 0.2(=1/5)f_{samp}$ in the frequency converting units 21 ((2) in FIG. 19).

In the low-pass filter units 22 and 23, a ratio of a desired signal bandwidth to be extracted to the sampling rate is higher than that in the first embodiment. Therefore, the frequency characteristic shown in (3) in FIG. 3 in the first embodiment is insufficient and the desired signal #0 (or #1) is extracted with a sharper frequency characteristic shown in (3) in FIG. 19. While operations of the frequency-conversion and reception low-pass-filter units 101 to 114 during demultiplexing have been explained, similar changes are executed for the frequency converting units 21 and the low-pass filter units 22 and 23 in the transmission low-pass-filter and frequency-converting units 311 to 324 during multiplexing.

While the sampling rate of the reception channel-filter units 121 to 128 is 2Fc in the first embodiment, the sampling rate thereof is lowered to 1.25Fc in the present embodiment. Accordingly, a halfband filter as explained in the first embodiment cannot be applied thereto. However, because an oversampling rate with respect to a signal band is lowered (2 times to 1.25 times), the number of required taps is reduced, thereby suppressing increase in the circuit scale. It suffices that the reception channel-filter units 121 to 128 in the present embodiment have a filter design that enables to realize the sampling rate of 1.25Fc with maintaining the frequency characteristic shown in FIG. 5.

As described above, in the present embodiment, a ratio between the sampling rate and the signal bandwidth to be processed do not necessarily have a relation of 2:1 and the ratio can be lowered (1.25:1 in the above example) by executing the changes (1) to (3) mentioned above, resulting in lower power consumption caused by reduction in the sampling rate.

INDUSTRIAL APPLICABILITY

As described above, the demultiplexing device according to the present invention is useful as a device that demultiplexes wireless communication signals and is particularly suitable for a case where multirate signals are demultiplexed.

REFERENCE SIGNS LIST

11 A/D CONVERTING UNIT
12 DIGITAL DEMULTIPLEXING UNIT
13, 13a FILTER-BANK CONTROL UNIT
14 RECEPTION-CLOCK SUPPLY UNIT
15 NON-REGENERATIVE SWITCH-MATRIX UNIT
16 SELECTOR UNIT
17 DEMODULATING AND DECODING UNIT
18 REGENERATIVE SWITCH-MATRIX UNIT
21 FREQUENCY CONVERTING UNIT
22 LOW-PASS FILTER UNIT
23 LOW-PASS FILTER UNIT
24 DOWNSAMPLER UNIT
25 UPSAMPLER UNIT
31 CODING AND MODULATING UNIT
32 SELECTOR UNIT
33 TRANSMISSION-CLOCK SUPPLY UNIT
34 DIGITAL MULTIPLEXING UNIT
35 D/A CONVERTING UNIT
40 RECEPTION-SIDE REARRANGING UNIT
41 REGENERATING MULTIPLEXING UNIT
42 REGENERATING DEMULTIPLEXING UNIT
43 TRANSMISSION-SIDE REARRANGING UNIT
101 to 114 FREQUENCY-CONVERSION AND RECEPTION LOW-PASS-FILTER UNIT
121 to 128 RECEPTION CHANNEL-FILTER UNIT
211 LOCAL-SIGNAL GENERATING UNIT
212 COMPLEX MULTIPLYING UNIT
221 to 239 REGISTER UNIT
240 to 250 MULTIPLIER
251 REAL-NUMBER ADDING UNIT
252 SHIFT REGISTER UNIT
301 to 308 TRANSMISSION CHANNEL-FILTER UNIT
311 to 324 TRANSMISSION LOW-PASS-FILTER AND FREQUENCY-CONVERTING UNIT
331 to 337 ADDER

The invention claimed is:

1. A demultiplexing device that demultiplexes a reception signal into $2^N$ waves (N is a natural number equal to or larger than one), the demultiplexing device comprising:
a reception low-pass-filter group including $2^{N+1}-2$ frequency-converting and reception low-pass-filter units that each perform a frequency converting process and a low-pass filtering process for the reception signal to cause the reception signal to pass through a desired band, further perform downsampling to reduce a sampling rate to half of a data rate of an input signal, and output a processed signal, having the frequency-converting and reception low-pass-filter units arranged in a tree with an N-stage configuration, dividing an output signal from each of frequency-converting and reception low-pass-filter units arranged at an Mth stage (1≤M≤N) into two, and inputting the divided signals to two different frequency-converting and reception low-pass-filter units at a subsequent stage, respectively; and a reception channel-filter group including $2^N$ reception channel-filter units that waveform-shape the signals from the frequency-converting and reception low-pass-filter units according to a desired frequency characteristic to output the waveform-shaped signals and are arranged to connect to $2^N$ frequency-converting and reception low-pass-filter units at an Nth stage in a one-to-one relation.

2. The demultiplexing device according to claim 1, further comprising:
a filter-bank control unit that generates a clock control signal for controlling clock supply to frequency-converting and reception low-pass-filter units and reception channel-filter units corresponding to a signal passage band, based on channel information; and
a reception-clock supply unit that supplies a clock to frequency-converting and reception low-pass-filter units and reception channel-filter units corresponding to a signal passage band, based on the clock control signal.

3. A relay device comprising:
the demultiplexing device according to claim 2;
a multiplexing device including,
a transmission-channel filter group including $2^N$ transmission channel-filter units that waveform-shape the input signals according to a desired frequency characteristic and output the signals;
a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth (1≤M≤N) stage to a transmission low-pass-filter and frequency-converting unit at a subsequent stage; and
$2^N-1$ adding units that each perform an adding process for signals output from two transmission low-pass-filter and frequency converting units having desired bands adjacent to each other;
a filter-bank control unit that generates a clock control signal for controlling clock supply to transmission channel-filter units, transmission low-pass-filter and frequency-converting units, and adding units corresponding to signal passage bands, based on channel information; and
a transmission-clock supply unit that supplies a clock to transmission channel-filter units, transmission low-pass-filter and frequency-converting units, and adding units corresponding to signal passage bands, based on the clock control signal; and a non-regenerative switch-matrix unit that receives signals output from the demultiplexing device as inputs, selects some or all of the input signals based on a route setting signal for outputting desired signals, rearranges the signals in a frequency direction, and outputs the rearranged signal to the multiplexing device, wherein
filter-bank control units redundant in the demultiplexing device and the multiplexing device are merged in one configuration.

4. The demultiplexing device according to claim 1, further comprising:
a selector unit that selects regenerative relay signals from A/D-converted signals or the output signals from the frequency-converting and reception low-pass-filter units; and
a demodulating and decoding unit that demodulates and decodes the regenerative relay signals.

5. A relay device comprising:
the demultiplexing device according to claim 4;
a multiplexing device comprising:
a transmission-channel filter group including $2^N$ transmission channel-filter units that waveform-shape the input signals according to a desired frequency characteristic and output the signals;
a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth (1≤M≤N) stage to a transmission low-pass-filter and frequency-converting unit at a subsequent stage; and
$2^N-1$ adding units that each perform an adding process for signals output from two transmission low-pass-filter and frequency converting units having desired bands adjacent to each other;
a coding and modulating unit that codes and modulates signals; and
a selector unit that distributes the coded and modulated signals to input stages of the transmission channel-filter units or output stages of the adding units; and
a regenerative switch-matrix unit that receives demodulated and decoded signals output from the demultiplexing device as inputs, and outputs the signals to the coding and modulating unit in the multiplexing device based on a set route.

6. The demultiplexing device according to claim 1, wherein low-pass filters used in the frequency-converting and reception low-pass-filter units are halfband filters.

7. A relay device comprising:
the demultiplexing device according to claim 6;
a multiplexing device including,
a transmission-channel filter group including $2^N$ transmission channel-filter units that waveform-shape the input signals according to a desired frequency characteristic and output the signals;

a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth ($1 \leq M \leq N$) stage to a transmission low-pass-filter and frequency-converting unit at a subsequent stage;

$2^N-1$ adding units that each perform an adding process for signals output from two transmission low-pass-filter and frequency converting units having desired bands adjacent to each other, wherein low-pass filters used in the transmission low-pass-filter and frequency-converting units are halfband filters; and a non-regenerative switch-matrix unit that receives signals output from the demultiplexing device as inputs, selects some or all of the input signals based on a route setting signal for outputting desired signals, rearranges the signals in a frequency direction, and outputs the rearranged signal to the multiplexing device.

8. The demultiplexing device according to claim 1, further comprising:

a reception-side rearranging unit that selects some or all of the signals output from the reception channel-filter units based on a rearrangement instruction signal for changing signal positions in a frequency direction, rearranges the selected signals in the frequency direction, and outputs the rearranged signals;

a regenerating multiplexing unit that includes a plurality of transmission low-pass-filter and frequency-converting units that interpolate signals to obtain a sampling rate twice as high as a data rate of an input signal, then perform a low-pass filtering process and a frequency converting process for causing the signals to pass through desired bands, and output the processed signals, and a plurality of adding units, being configured in a tree, and adds signals output from two transmission low-pass-filter and frequency converting units having desired bands adjacent to each other with a corresponding one of the adding units to be input to a transmission low-pass-filter and frequency-converting unit at a subsequent stage; and a demodulating and decoding unit that demodulates and decodes reception signals, wherein the regenerating multiplexing unit receives the signals output from the reception-side rearranging unit, and, when signals to be demodulated are restored in a process of multiplexing, outputs the signals to the demodulating and decoding unit, and the demultiplexing and decoding unit demodulates and decodes the output signals from the regenerating multiplexing unit.

9. The demultiplexing device according to claim 8, wherein the reception-side rearranging unit changes signal positions based on the rearrangement instruction signal to output signals to input positions of the regenerating multiplexing unit, in which number of times of multiplexing performed in the regenerating multiplexing unit is smallest.

10. A relay device comprising:

the demultiplexing device according to claim 8;

a multiplexing device including, a transmission-channel filter group including $2^N$ transmission channel-filter units that waveform-shape the input signals according to a desired frequency characteristic and output the signals;

a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth ($1 \leq M \leq N$) stage to a transmission low-pass-filter and frequency-converting unit at a subsequent stage; and $2^N-1$ adding units that each perform an adding process for signals output from two transmission low-pass-filter and frequency converting units having desired bands adjacent to each other;

a coding and modulating unit that codes and modulates signals;

a regenerating demultiplexing unit that includes a plurality of frequency-converting and reception low-pass-filter units each performing a frequency converting process and a low-pass filtering process for an input signal to cause the input signal to pass through a desired band, further performing downsampling to reduce a sampling rate to half of a data rate of the input signal, and outputting a processed signal, being arranged in a tree, divides the output signal from each of the frequency-converting and reception low-pass-filter units into two, and inputs the divided signals to two different frequency-converting and reception low-pass-filter units at a subsequent stage, respectively; and a transmission-side rearranging unit that receives signals demultiplexed by the regenerating demultiplexing unit, selects some or all of the received signals based on a rearrangement instruction signal, rearranges the selected signals in the frequency direction, and outputs the rearranged signals to the transmission-channel filter group, wherein the regenerating demultiplexing unit receives modulated signals output from the coding and modulating unit according to bandwidths in a middle of the tree, demultiplexes the modulated signals to have bandwidths that can be input to the transmission channel-filter units, and outputs demultiplexed signals; and a regenerative switch-matrix unit that receives demodulated and decoded signals output from regeneration of the demultiplexing device as inputs, and outputs the signals to the coding and modulating unit in the multiplexing device based on a set route.

11. A multiplexing device that multiplexes input signals corresponding to $2^N$ waves (N is a natural number equal to or larger than one), the multiplexing device comprising:
- a transmission-channel filter group including $2^N$ transmission channel-filter units that waveform-shape the input signals according to a desired frequency characteristic and output the signals;
- a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth ($1 \leq M \leq N$) stage to a transmission low-pass-filter and frequency-converting unit at a subsequent stage; and
- $2^N-1$ adding units that each perform an adding process for signals output from two transmission low-pass-filter and frequency converting units having desired bands adjacent to each other.

12. The multiplexing device according to claim 11, further comprising:
- a filter-bank control unit that generates a clock control signal for controlling clock supply to transmission channel-filter units, transmission low-pass-filter and frequency-converting units, and adding units corresponding to signal passage bands, based on channel information; and
- a transmission-clock supply unit that supplies a clock to transmission channel-filter units, transmission low-pass-filter and frequency-converting units, and adding units corresponding to signal passage bands, based on the clock control signal.

13. The multiplexing device according to claim 11, further comprising:
- a coding and modulating unit that codes and modulates signals; and
- a selector unit that distributes the coded and modulated signals to input stages of the transmission channel-filter units or output stages of the adding units.

14. The multiplexing device according to claim 11, wherein low-pass filters used in the transmission low-pass-filter and frequency-converting units are halfband filters.

15. The multiplexing device according to claim 11, further comprising:
- a coding and modulating unit that codes and modulates signals;
- a regenerating demultiplexing unit that includes a plurality of frequency-converting and reception low-pass-filter units each performing a frequency converting process and a low-pass filtering process for an input signal to cause the input signal to pass through a desired band, further performing downsampling to reduce a sampling rate to half of a data rate of the input signal, and outputting a processed signal, being arranged in a tree, divides the output signal from each of the frequency-converting and reception low-pass-filter units into two, and inputs the divided signals to two different frequency-converting and reception low-pass-filter units at a subsequent stage, respectively; and
- a transmission-side rearranging unit that receives signals demultiplexed by the regenerating demultiplexing unit, selects some or all of the received signals based on a rearrangement instruction signal, rearranges the selected signals in the frequency direction, and outputs the rearranged signals to the transmission-channel filter group, wherein
the regenerating demultiplexing unit receives modulated signals output from the coding and modulating unit according to bandwidths in a middle of the tree, demultiplexes the modulated signals to have bandwidths that can be input to the transmission channel-filter units, and outputs demultiplexed signals.

16. The multiplexing device according to claim 15, wherein the coding and modulating unit outputs, based on the rearrangement instruction signal, the signal to an input position of the regenerating demultiplexing units, in which number of times of demultiplexing in the regenerating demultiplexing units is smallest.

17. A relay device comprising:
- the demultiplexing device according to claim 1;
- a multiplexing device including,
    - a transmission-channel filter group including $2^N$ transmission channel-filter units that waveform-shape the input signals according to a desired frequency characteristic and output the signals;
    - a transmission low-pass-filter group including $2^{N+1}-2$ transmission low-pass-filter and frequency-converting units that interpolate the waveform-shaped signals to obtain a sampling rate twice as high as a data rate of an input signal, then perform a low-pass filtering process and a frequency converting process for causing the signals to pass through desired bands, and output the processed signals, having the transmission low-pass-filter and frequency-converting units arranged in a tree with an N-stage configuration, having $2^N$ transmission low-pass-filter and frequency-converting units at a first stage connected to the transmission channel-filter units in a one-to-one relation, and inputting each combination of two output signals in adjacent bands from transmission low-pass-filter and frequency-converting units arranged at an Mth ($1 \leq M \leq N$) stage to a transmission low-pass-filter and frequency-converting unit at a subsequent stage; and
    - $2^N-1$ adding units that each perform an adding process for signals output from two transmission low-pass-filter and frequency converting units having desired bands adjacent to each other; and
- a non-regenerative switch-matrix unit that receives signals output from the demultiplexing device as inputs, selects some or all of the input signals based on a route setting signal for outputting desired signals, rearranges the signals in a frequency direction, and outputs the rearranged signal to the multiplexing device.

18. The relay device according to claim 17, wherein either the reception-channel filter units included in the demultiplexing device or the transmission-channel filter units included in the multiplexing device are eliminated, and inputs are directly connected to outputs.

* * * * *